(12) United States Patent
Macmaster

(10) Patent No.: US 10,438,953 B1
(45) Date of Patent: Oct. 8, 2019

(54) INTEGRATED CIRCUITRY CONSTRUCTION, A DRAM CONSTRUCTION, AND A METHOD USED IN FORMING AN INTEGRATED CIRCUITRY CONSTRUCTION

(71) Applicant: Micron Technology, Inc., Boise, ID (US)

(72) Inventor: Dylan R. Macmaster, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/043,893

(22) Filed: Jul. 24, 2018

(51) Int. Cl.
| | | |
|---|---|---|
| *G11C 11/40* | (2006.01) | |
| *H01L 27/108* | (2006.01) | |
| *G11C 11/401* | (2006.01) | |
| *H01L 23/48* | (2006.01) | |
| *H01L 21/768* | (2006.01) | |

(52) U.S. Cl.
CPC ...... *H01L 27/10823* (2013.01); *G11C 11/401* (2013.01); *H01L 21/76898* (2013.01); *H01L 23/481* (2013.01); *H01L 27/10855* (2013.01); *H01L 27/10885* (2013.01)

(58) Field of Classification Search
CPC combination set(s) only.
See application file for complete search history.

(56) References Cited

U.S. PATENT DOCUMENTS 9,564,442 B2   2/2017   Tang et al.
2016/0300842 A1   10/2016   Tang et al.

*Primary Examiner* — Matthew L Reames
(74) *Attorney, Agent, or Firm* — Wells St. John P.S.

(57) ABSTRACT

An integrated circuitry construction comprises a substrate comprising conductive nodes of integrated circuitry. A conductive line structure is above the conductive nodes. Elevationally-extending conductive vias are spaced longitudinally along the conductive line structure. The conductive vias individually directly electrically couple the conductive line structure to individual of the conductive nodes. The conductive line structure comprises conductive material directly electrically coupled to the conductive vias and extending between immediately-longitudinally-adjacent of the conductive vias. An upper insulative material is directly below the conductive material between the immediately-longitudinally-adjacent conductive vias. Doped or undoped semiconductor material directly is below the upper insulative material between the immediately-longitudinally-adjacent conductive vias. A lower insulative material is directly below the semiconductor material between the immediately-longitudinally-adjacent conductive vias. Other aspects, including method, are disclosed.

25 Claims, 26 Drawing Sheets

US 10,438,953 B1

INTEGRATED CIRCUITRY CONSTRUCTION, A DRAM CONSTRUCTION, AND A METHOD USED IN FORMING AN INTEGRATED CIRCUITRY CONSTRUCTION

TECHNICAL FIELD

Embodiments disclosed herein pertain to integrated circuitry constructions, to dynamic random access memory (DRAM) constructions, and to methods used in forming an integrated circuitry construction.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

A continuing goal in fabrication of memory and other circuitry is to make ever-smaller and closer-spaced components. Unfortunately, undesired parasitic capacitance occurs and increases the closer conductors are placed next to one another and can adversely impact design and operation of circuitry.

DETAILED DESCRIPTION OF EXAMPLE EMBODIMENTS

Embodiments of the invention encompass integrated circuitry constructions, such as DRAM constructions, and methods used in forming an integrated circuitry construction, such as a DRAM construction. First example embodiments comprising a DRAM construction are described with reference to FIGS. 1-8 showing an example fragment of a substrate construction 8 comprising an array or array area 10 that has been fabricated relative to a base substrate 11. Substrate 11 may comprise any one or more of conductive/conductor/conducting (i.e., electrically herein), semiconductive/semiconductor/semiconducting, and insulative/insulator/insulating (i.e., electrically herein) materials. Various materials are above base substrate 11. Materials may be aside, elevationally inward, or elevationally outward of the FIGS. 1-8-depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Figure 1:
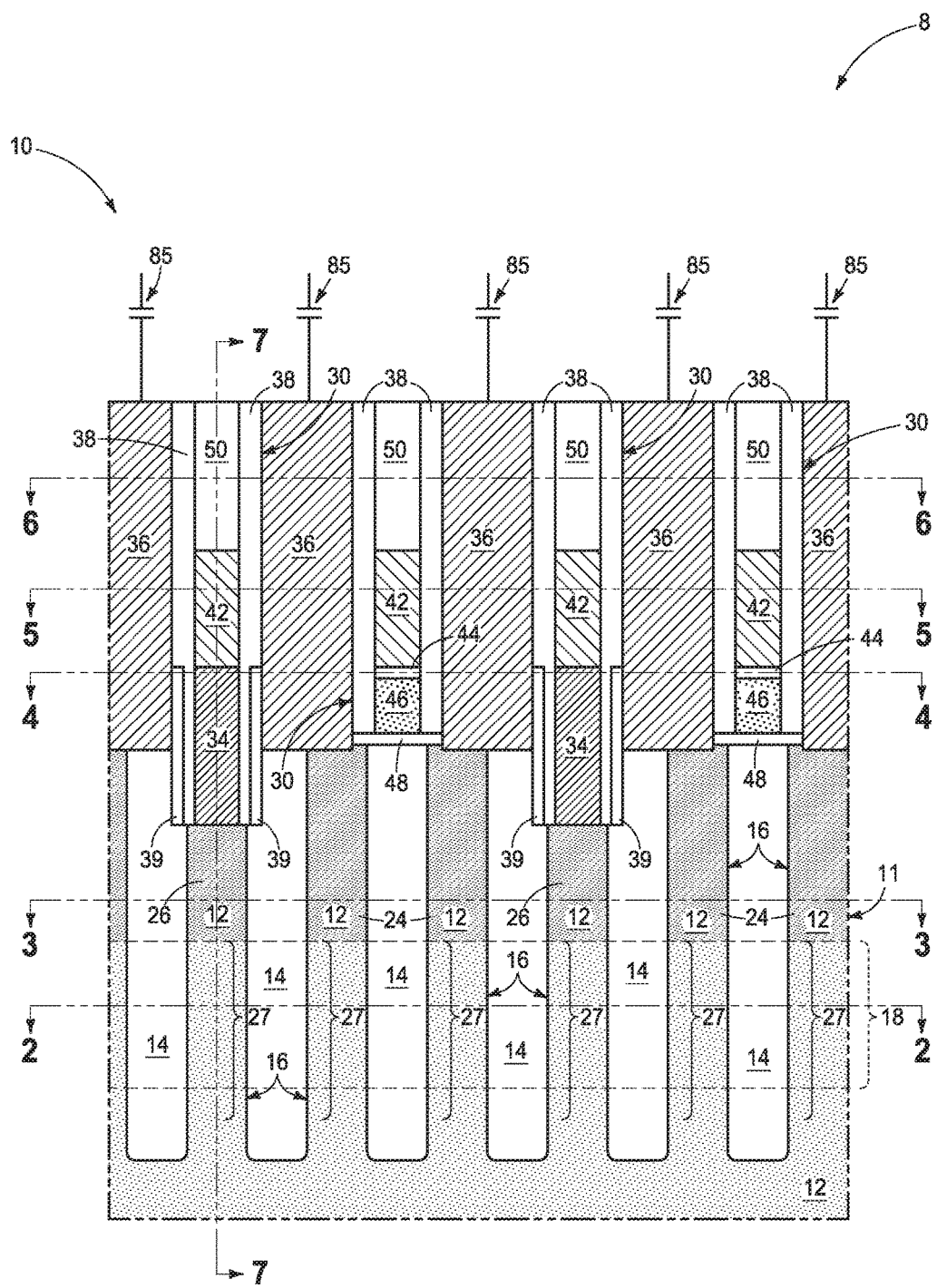
FIG. 1 is a diagrammatic hybrid schematic and cross-sectional view of a portion of a DRAM construction in accordance with some embodiments of the invention and is taken through line 1-1 in FIGS. 1-8.
Figure 2:
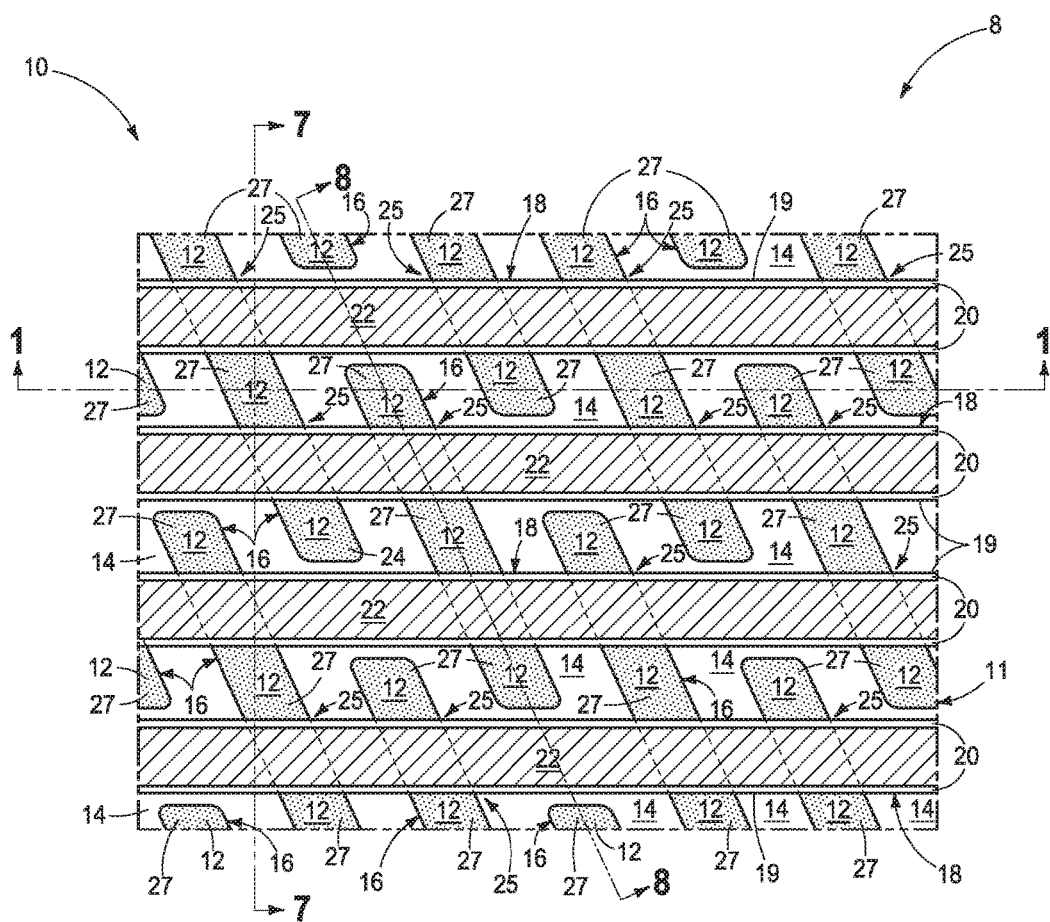
FIG. 2 is a view taken through line 2-2 in FIGS. 1, 7, and 8.
Figure 3:
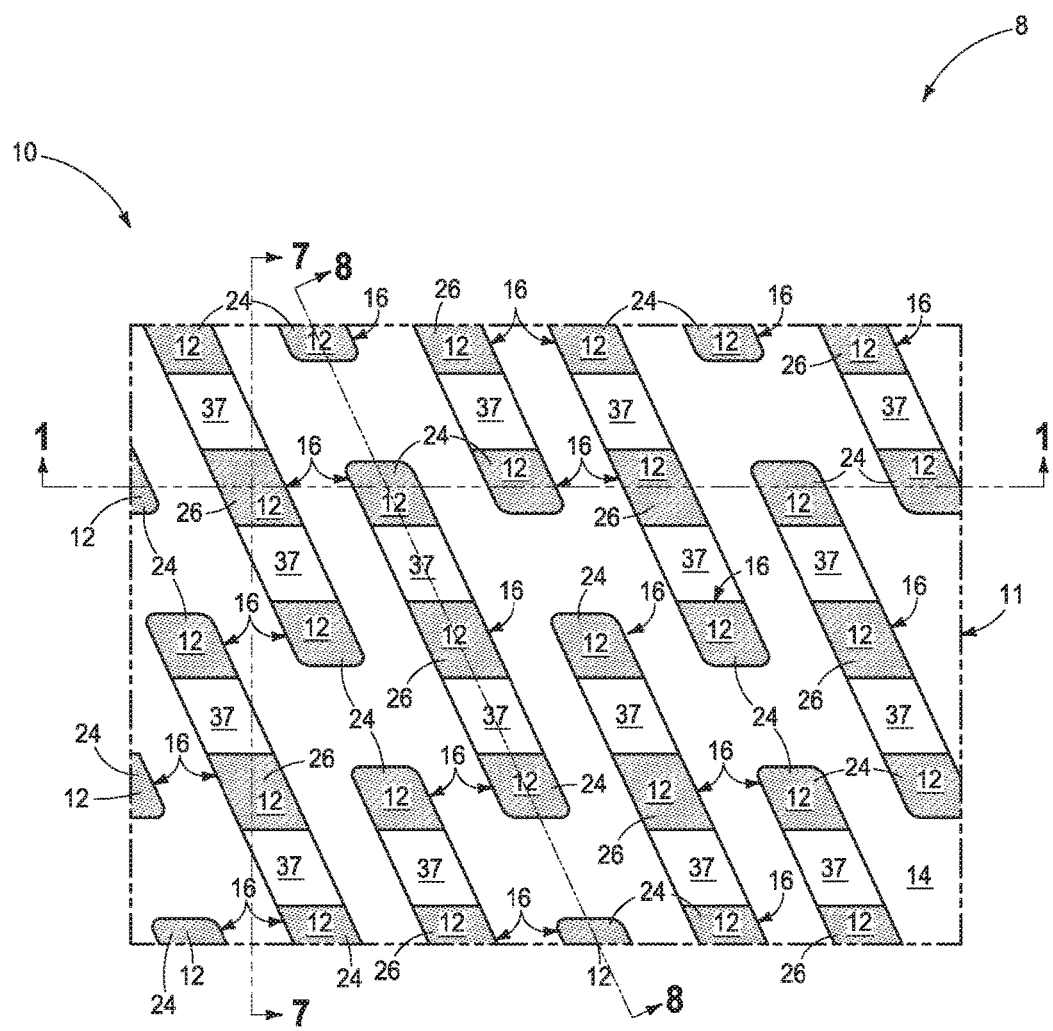
FIG. 3 is a view taken through line 3-3 in FIGS. 1, 7, and 8.
Figure 8:
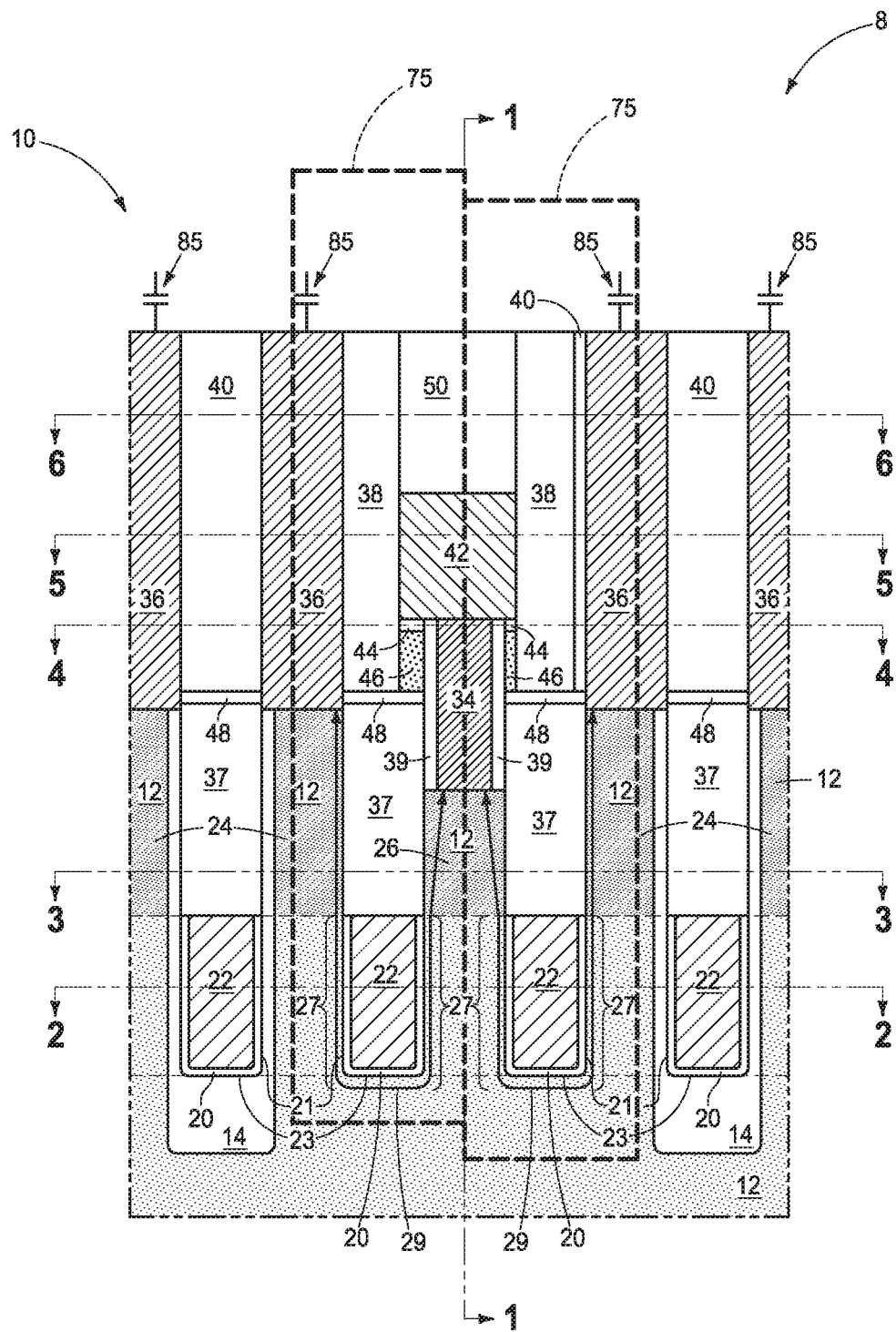
FIG. 8 is a view taken through line 8-8 in FIGS. 2-6.

Base substrate 11 comprises semiconductive material 12 (e.g., appropriately and variously doped monocrystalline and/or polycrystalline silicon, Ge, SiGe, GaAs, and/or other existing or future-developed semiconductive material), trench isolation regions 14 (e.g., silicon nitride and/or silicon dioxide), and active area regions 16 comprising suitably and variously-doped semiconductive material 12. In one embodiment, construction 8 comprises memory cells 75 (FIG. 8, and with only four outlines 75 shown in FIGS. 4 and 5 for clarity in such figures), for example DRAM memory cells individually comprising a field effect transistor device 25 (FIG. 2) and a charge-storage device 85 (e.g., a capacitor; FIGS. 1 and 8). However, embodiments of the invention encompass other memory cells and other constructions of integrated circuitry independent of whether containing memory cells.

Field effect transistors 25 are in the form of recessed access devices (a type of construction of a field effect transistor), with example construction 8 showing such recessed access devices grouped in individual pairs of such devices. Individual recessed access devices 25 include a buried access line construction 18, for example that is within a trench 19 in semiconductive material 12. Constructions 18 comprise conductive gate material 22 (e.g., conductively-doped semiconductor material and/or metal material) that functions as a conductive gate of individual devices 25. A gate insulator 20 (e.g., silicon dioxide and/or silicon nitride) is along sidewalls 21 and a base 23 of individual trenches 19 between conductive gate material 22 and semiconductive material 12. Insulator material 37 (e.g., silicon dioxide and/or silicon nitride) is within trenches 19 above materials 20 and 22. Individual devices 25 comprise a pair of source/drain regions 24, 26 in upper portions of semiconductive material 12 on opposing sides of individual trenches 19 (e.g., regions 24, 26 being laterally outward of and higher than access line constructions 18). Each of source/drain regions 24, 26 comprises at least a part thereof having a conductivity-increasing dopant therein that is of maximum concentration of such conductivity-increasing dopant within the respective source/drain region 24, 26, for example to render such part to be conductive (e.g., having a maximum dopant concentration of at least $10^{19}$ atoms/cm$^3$). Accordingly, all or only a part of each source/drain region 24, 26 may have such maximum concentration of conductivity-increasing dopant. Source/drain regions 24 and/or 26 may include other doped regions (not shown), for example halo regions, LDD regions, etc.

One of the source/drain regions (e.g., region 26) of the pair of source/drain regions in individual of the pairs of recessed access devices 25 is laterally between conductive gate material 22 and is shared by the pair of devices 25. Others of the source/drain regions (e.g., regions 24) of the pair of source/drain regions are not shared by the pair of devices 25. Thus, in the example embodiment, each active area region 16 comprises two devices 25 (e.g., one pair of devices 25), with each sharing a central source/drain region 26. A digitline structure 30 is directly electrically coupled to the one shared source/drain region 26 of multiple of the individual pairs of devices 25. A pair of capacitors 85 (FIGS. 1 and 8) individually are directly electrically coupled to one of the other source/drain regions 24 in the individual pairs of devices 25. Elevationally-extending conductive vias 34 (e.g., metal material and/or conductively-doped semiconductive material) are spaced longitudinally along digitline structure 30. Conductive vias 34 individually directly electrically couple digitline structure 30 to individual of shared source/drain regions 26 of the individual pairs of devices 25. Elevationally-extending conductive vias 36 (same or different composition from that of vias 34) are shown interconnecting non-shared source/drain regions 24 with individual capacitors 85. Example insulator material 38, 39 and/or 40 (e.g., silicon nitride and/or silicon dioxide) surrounds vias 34, 36.

A channel region 27 is in semiconductive material 12 below pair of source/drain regions 24, 26 along trench sidewalls 21 and around trench base 23. Channel region 27 may be suitably doped with a conductivity-increasing dopant likely of the opposite conductivity-type of the dopant in source/drain regions 24, 26, and for example that is at a maximum concentration in the channel of no greater than $1 \times 10^{17}$ atoms/cm$^3$. When suitable voltage is applied to gate material 22 of an access line construction 18, a conductive channel forms (e.g., along a channel current-flow line/path 29 [FIG. 8]) within channel region 27 proximate gate insulator 20 such that current is capable of flowing between a pair of source/drain regions 24 and 26 under the access line construction 18 within an individual active area region 16.

Stippling is diagrammatically shown to indicate primary conductivity-modifying dopant concentration (regardless of type), with denser stippling indicating greater dopant concentration and lighter stippling indicating lower dopant concentration. Conductivity-modifying dopant may be, and would likely be, in other portions of material 12 as shown. Only two different stippling densities are shown in material 12 for convenience, and additional dopant concentrations may be used and constant dopant concentration is not required in any region.

Digitline structure 30 comprises conductive material 42 (same or different composition from that of conductive vias 34 and/or 36) that is directly electrically coupled to conductive vias 34 and extends between immediately-longitudinally-adjacent of conductive vias 34. Digitline structure 30 comprises upper insulator material 50 (e.g., silicon nitride and/or silicon dioxide) above conductive material 42, and insulator material 38. Digitline structure 30 also comprises an upper insulative material 44 (e.g., one or more of silicon dioxide, silicon nitride, aluminum dioxide, hafnium oxide, etc., of an example thickness of 10 to 100 Angstroms) directly below conductive material 42 between immediately-longitudinally-adjacent conductive vias 34. Digitline structure 30 also comprises doped or undoped semiconductor material 46 (example thickness of 25 to 250 Angstroms) between immediately-longitudinally-adjacent conductive vias 34. In this document, "doped" and "undoped" are with reference to conductivity-modifying impurity present within example semiconductor material 46, with "undoped semiconductor material" defining from 0 atomic percent to less than 4.0 atomic percent conductivity-modifying dopant therein and "doped semiconductor" meaning at least 4.0 atomic percent up to and including 57.7 atomic percent conductivity-modifying impurity therein. Digitline structure 30 also comprises a lower insulative material 48 (e.g., one or more of silicon dioxide, silicon nitride, aluminum dioxide, hafnium oxide, etc., of an example thickness of 10 to 200 Angstroms) below semiconductor material 46 between immediately-longitudinally-adjacent conductive vias 34.

In one ideal embodiment, semiconductor material 46 is nowhere directly against conductive material 42 and is nowhere directly against any of conductive vias 34. In one embodiment, semiconductor material 46 is nowhere directly against any material that is conductive, for example whereby its voltage or any electric field therein in operation is allowed to float. In one embodiment, semiconductor material 46 is undoped, and in one such embodiment is devoid of conductivity-modifying impurity (i.e., no such impurity is detectable in material 46). In one embodiment, semiconductor material 46 is doped. In one such embodiment, semiconductor material 46 is semiconductively doped (i.e., from $1 \times 10^{15}$ atoms/cm$^3$ to less than $1 \times 10^{19}$ atoms/cm$^3$) and in another such embodiment is conductively doped (i.e., at least $1 \times 10^{19}$ atoms/cm$^3$, and e.g., less than $1 \times 10^{22}$ atoms/cm$^3$). In one embodiment, semiconductor material 46 comprises both doped and undoped portions.

In one embodiment, conductive material 42 predominately comprises (i.e., meaning more than 50% by volume up to and including 100% by volume) metal material and semiconductor material 46 predominately comprises a combination of polysilicon and conductivity-modifying dopant. In one embodiment, conductive vias 34 predominately comprise conductively-doped polysilicon.

Figure 4:
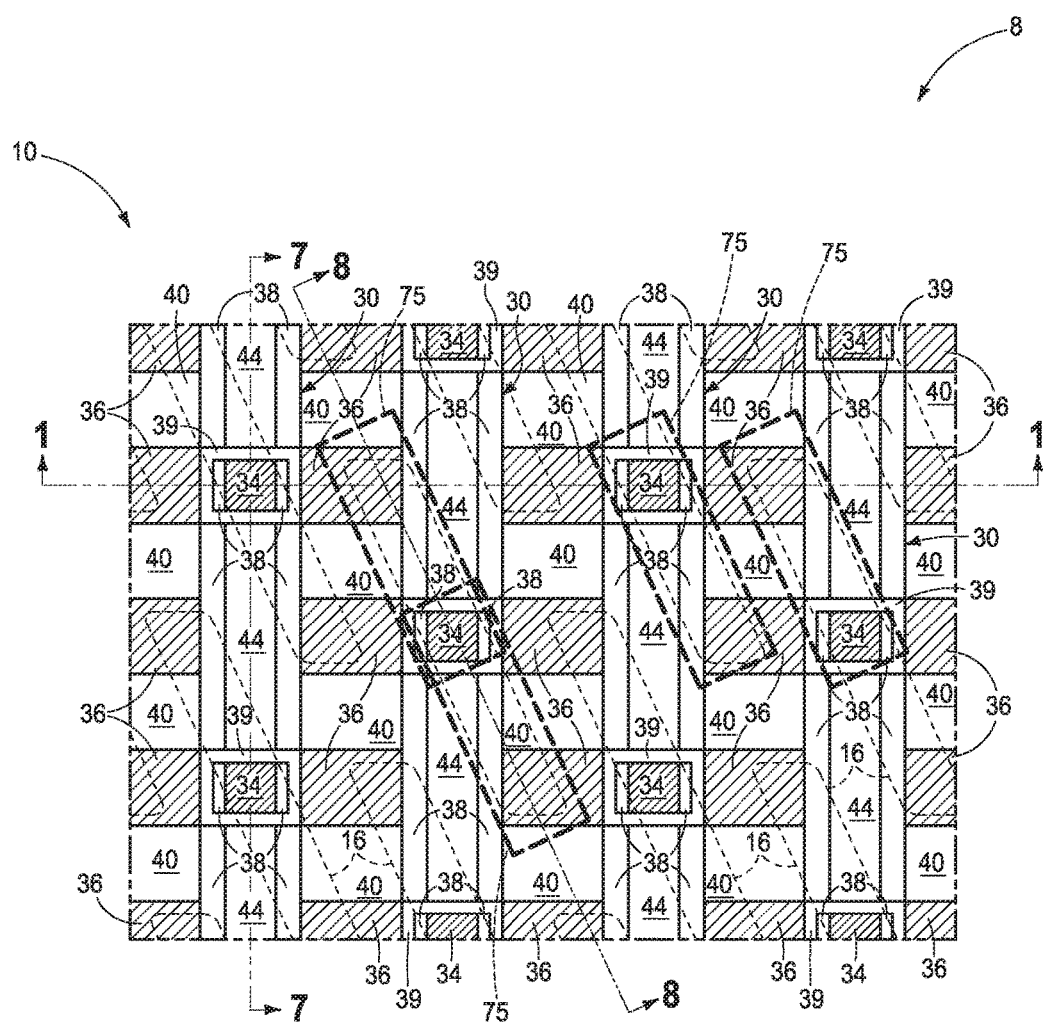
FIG. 4 is a view taken through line 4-4 in FIGS. 1, 7, and 8.
Figure 5:
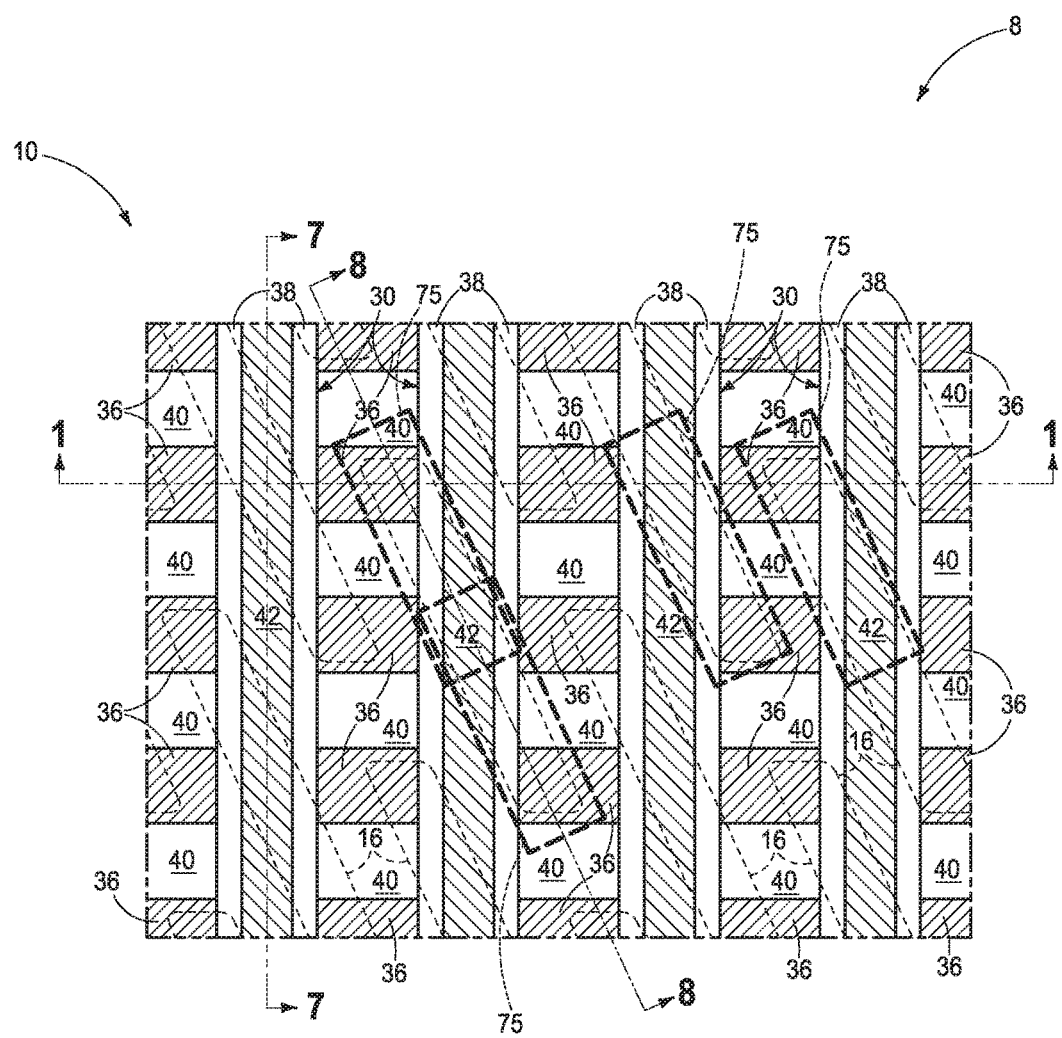
FIG. 5 is a view taken through line 5-5 in FIGS. 1, 7, and 8.
Figure 7:
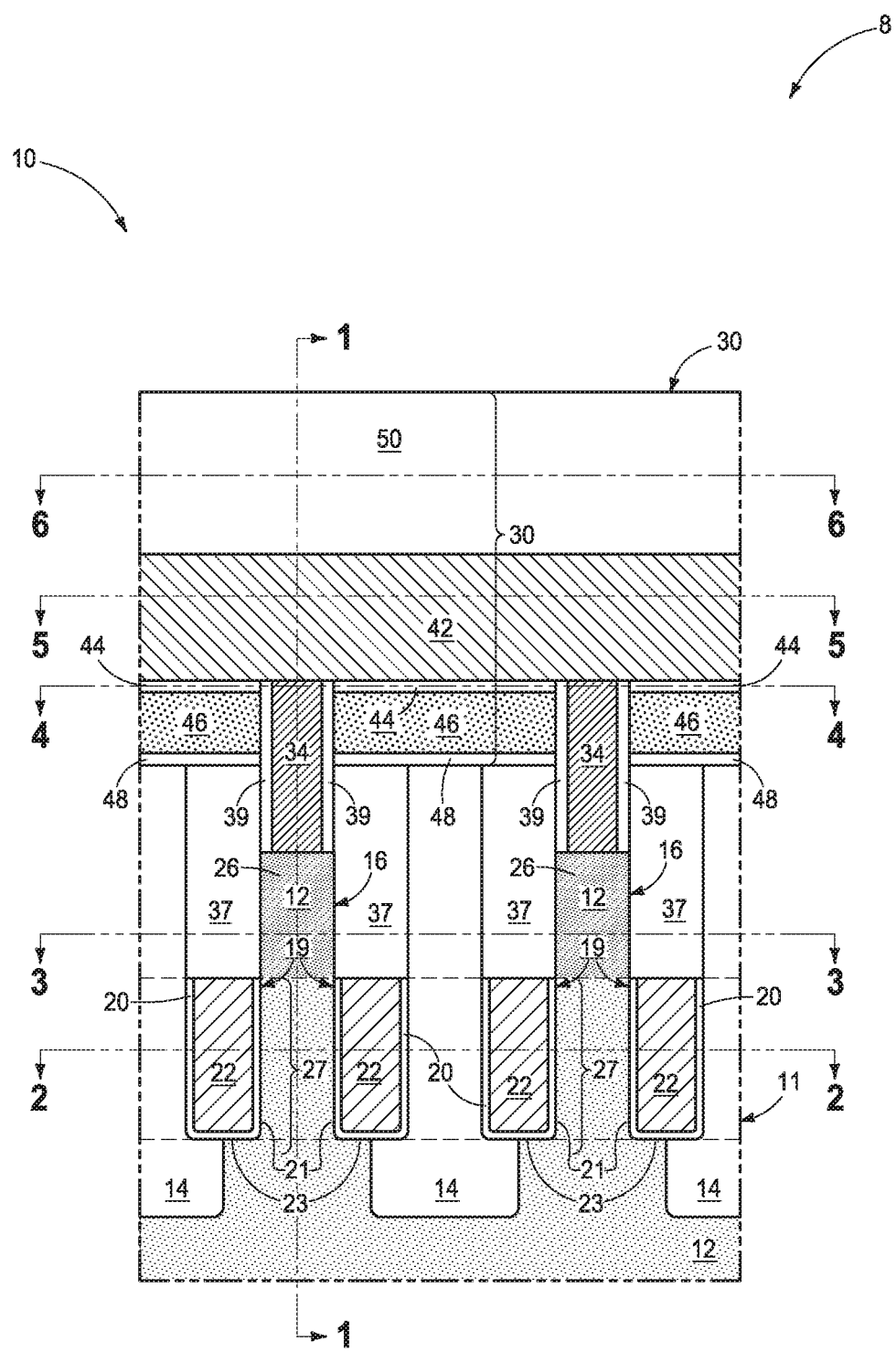
FIG. 7 is a view taken through line 7-7 in FIGS. 1-6.

In one embodiment, conductive material 42 is directly against a top surface of upper insulative material 44. In one embodiment, upper insulative material 44 is directly against a top surface of semiconductor material 46. In one embodiment, semiconductor material 46 is directly against a top surface of lower insulative material 48. In one embodiment, conductive vias 34 and upper insulative material 44 have respective planar top surfaces that in one embodiment are coplanar. In one embodiment, upper and lower insulative materials 44, 48, respectively, are of the same composition relative one another. In one such embodiment, insulator material 38 is of a composition different from that of upper and lower insulative materials 44, 48, with insulator material 38 being longitudinally between (a) and (b) along digitline structure 30, where (a) is upper insulative material 44, semiconductor material 46, and lower insulative material 48, and (b) is conductive vias 34 (FIGS. 4 and 7).

Any other attribute(s) or aspect(s) as shown and/or described herein with respect to other embodiments may be used.

Embodiments of the invention encompass an integrated circuitry construction (e.g., 8) independent of whether comprising DRAM or other memory circuitry. Such a construction comprises a substrate (e.g., 11) comprising conductive nodes (e.g., 24, 26) of integrated circuitry. A conductive line structure (e.g., 30, and independent of whether comprising a digitline) is above the conductive nodes. Elevationally-extending conductive vias (e.g., 34) are spaced longitudinally along the conductive line structure. The conductive vias individually directly electrically couple the conductive line structure to individual of the conductive nodes. The conductive line structure comprises a conductive material (e.g., 42) directly electrically coupled to the conductive vias and extending between immediately-longitudinally-adjacent of the conductive vias. The conductive line structure includes an upper insulative material (e.g., 44) directly below the conductive material between the immediately-longitudinally-adjacent conductive vias. The conductive line structure comprises doped or undoped semiconductor material (e.g., 46) directly below the upper insulative material between the immediately-longitudinally-adjacent conductive vias. The conductive line structure comprises a lower insulative material (e.g., 48) directly below the semiconductor material between the immediately-longitudinally-adjacent conductive vias. In one embodiment, the conductive line structure comprises a digitline of memory circuitry, and in one such embodiment the memory circuitry comprises DRAM (e.g., regardless of whether comprising any of the specific example construction described above with respect to FIGS. 1-8). Any other attribute(s) or aspect(s) as shown and/or described herein with respect to other embodiments may be used.

Embodiments of the invention encompass a method used in forming an integrated circuitry construction, for example comprising DRAM, other memory, and/or non-memory circuitry. Regardless, method aspects of the invention may use or have any of the above-described structural aspects.

Figure 9:
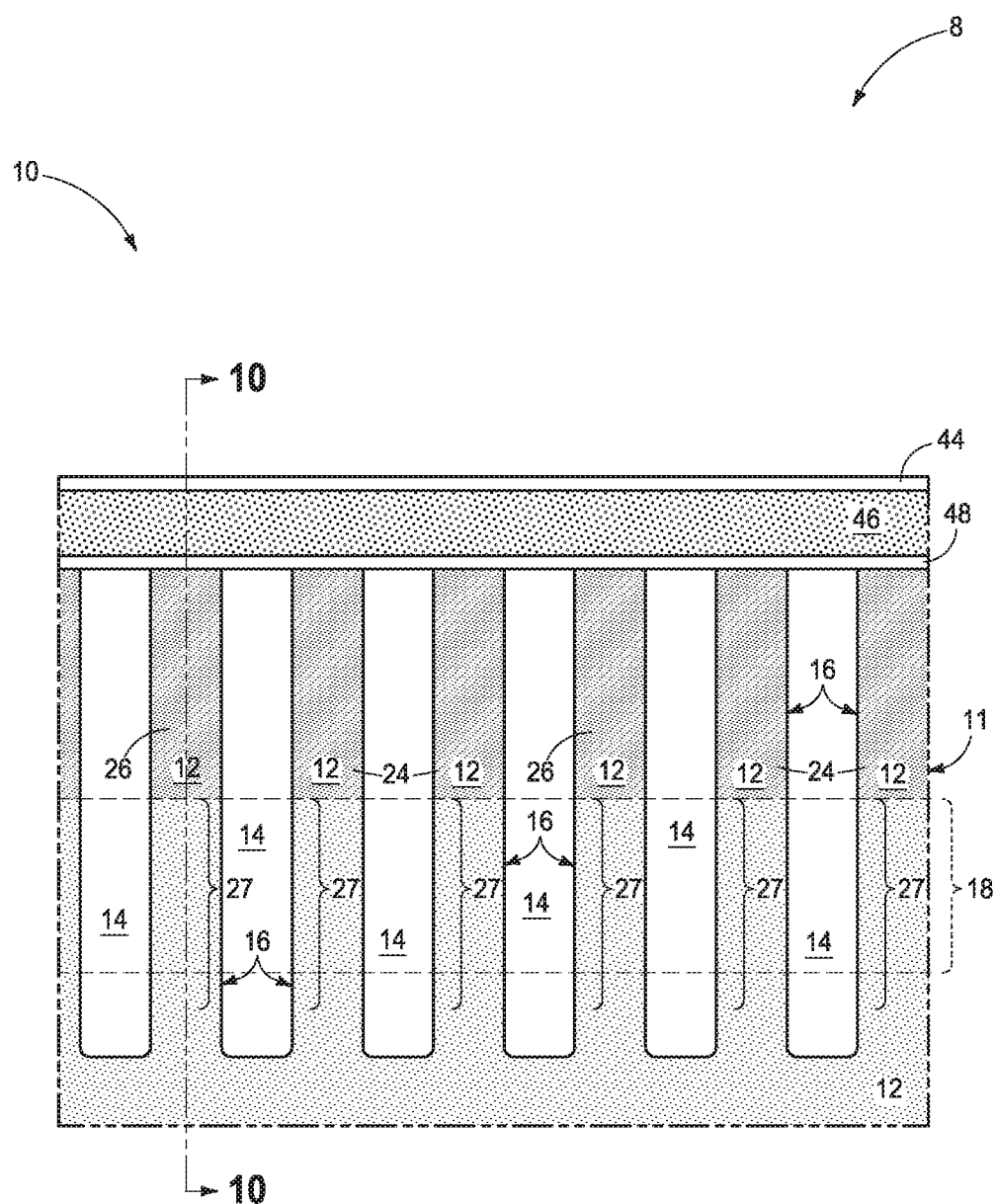
FIG. 9 is a diagrammatic cross-sectional view of a portion of a predecessor substrate construction to that of FIG. 1 in process in accordance with an embodiment of the invention and is taken through line 9-9 in FIG. 10.
Figure 10:
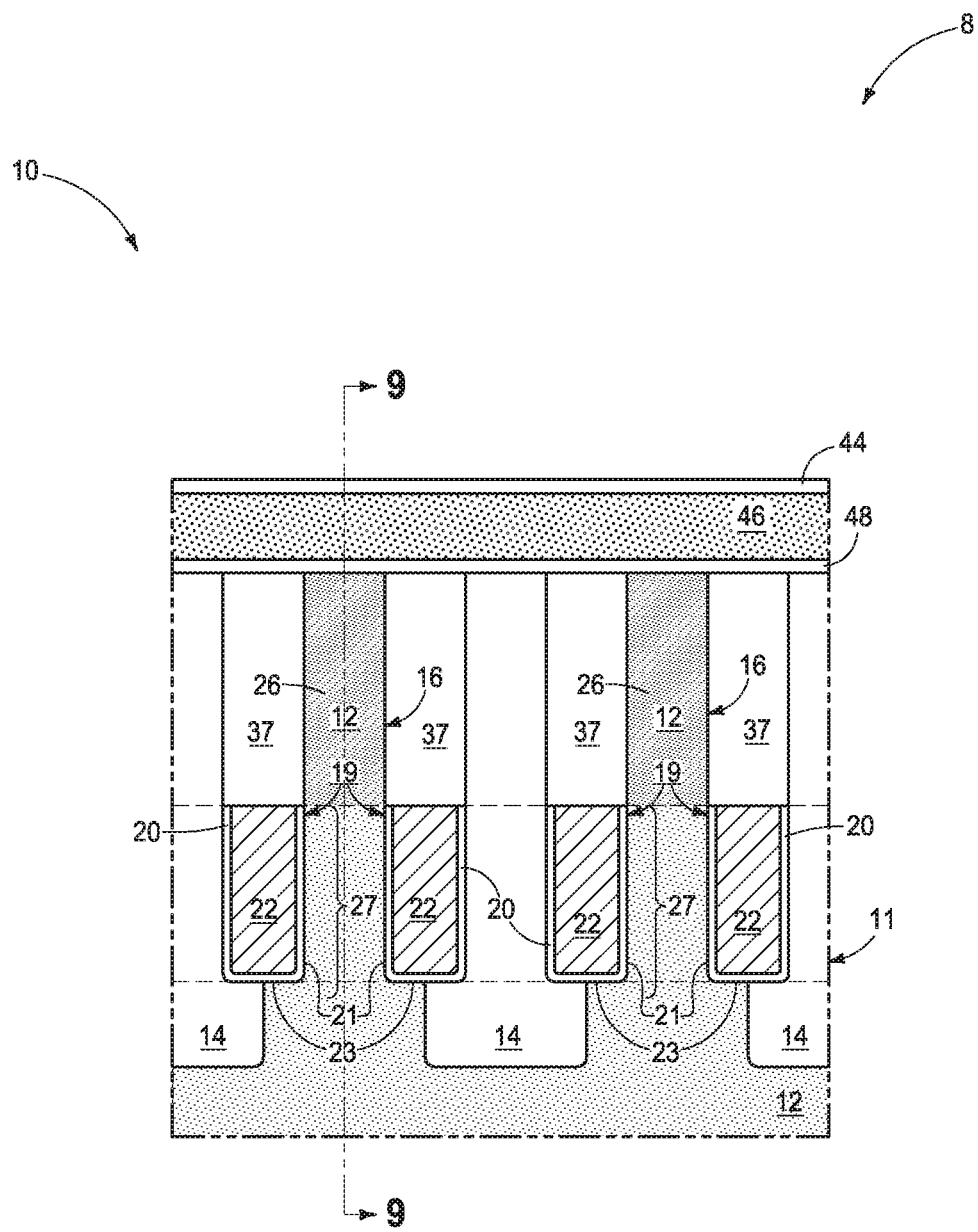
FIG. 10 is a view taken through line 10-10 in FIG. 9.

Referring to FIGS. 9 and 10, such a method comprises providing a substrate (e.g., 8) comprising conductive nodes (e.g., 26), a lower insulative material (e.g., 48) directly above the conductive nodes, doped or undoped semiconductor material (e.g., 46) directly above the lower insulative material, and an upper insulative material (e.g., 44) directly above the semiconductor material. In one embodiment, the conductive nodes are source/drain regions of recessed access devices (e.g., 25 in FIG. 2) which in one embodiment comprise DRAM.

Figure 11:
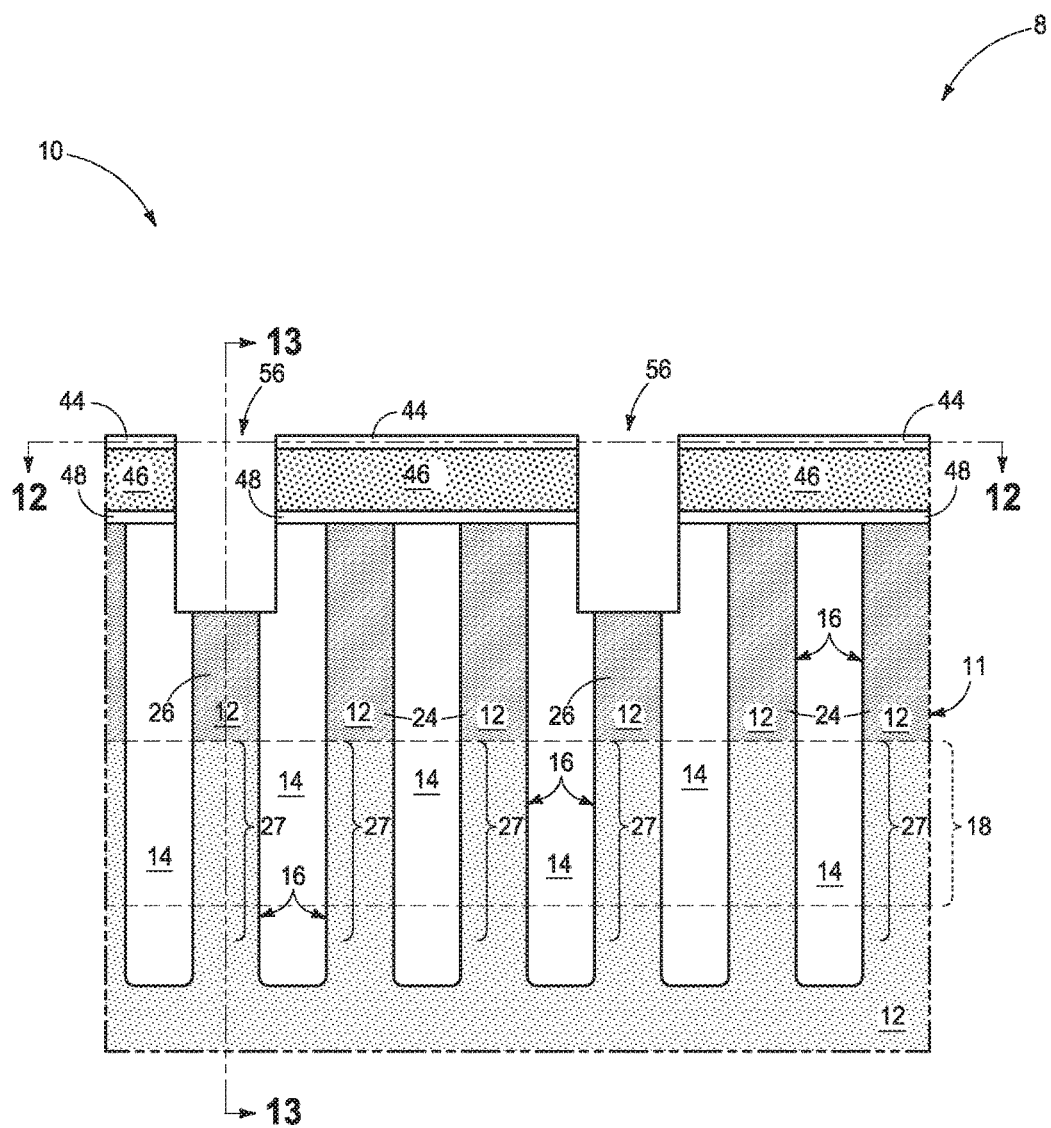
FIG. 11 is a view of the FIG. 9 substrate at a processing step subsequent to that shown by FIG. 9 and is taken through line 11-11 in FIGS. 12 and 13.
Figure 12:
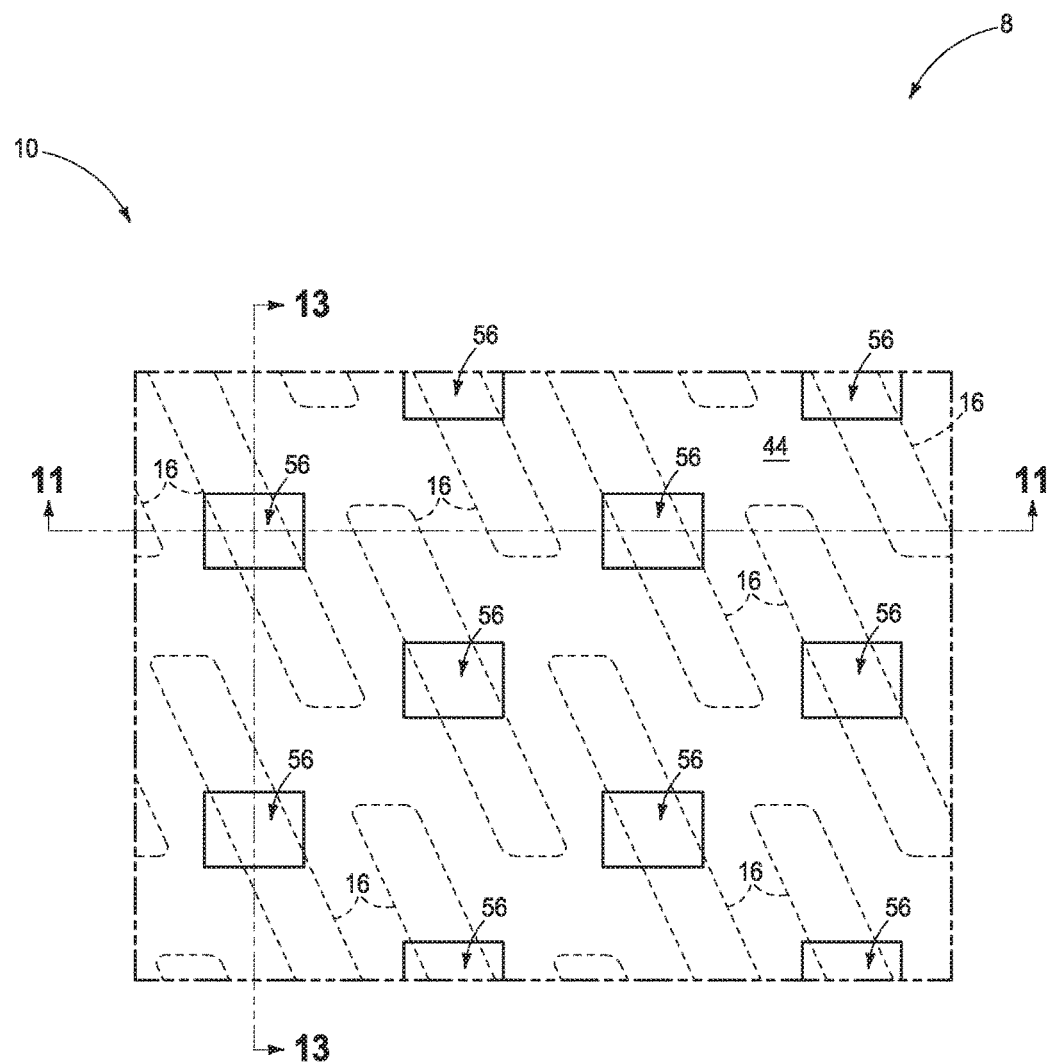
FIG. 12 is a view taken through line 12-12 in FIGS. 11 and 13.
Figure 13:
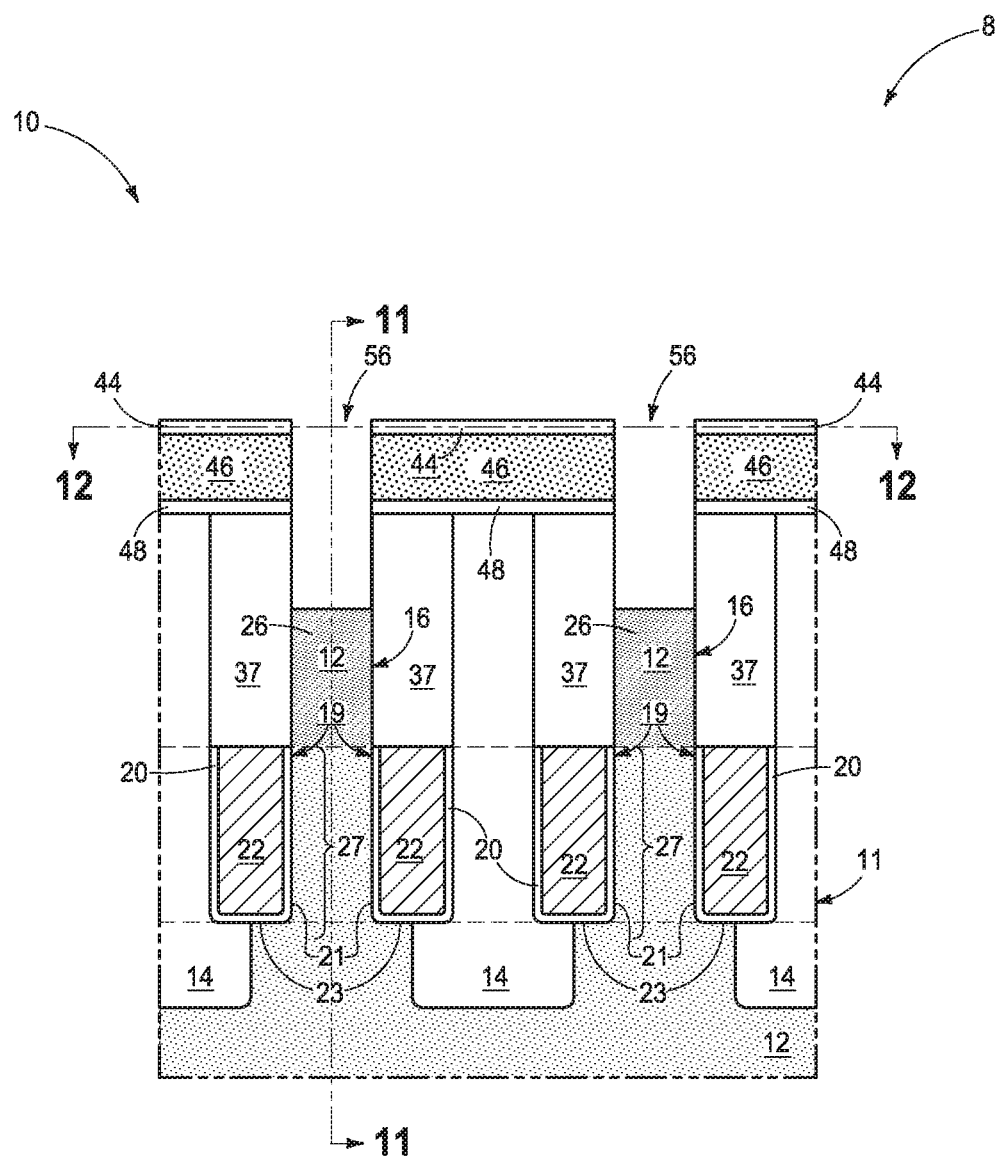
FIG. 13 is a view taken through line 13-13 in FIGS. 11 and 12.

Referring to FIGS. 11-13, contact openings (e.g., 56) have been formed through the upper insulative material, the semiconductor material, and the lower insulative material. The contact openings individually extend to individual of the conductive nodes.

Figure 14:
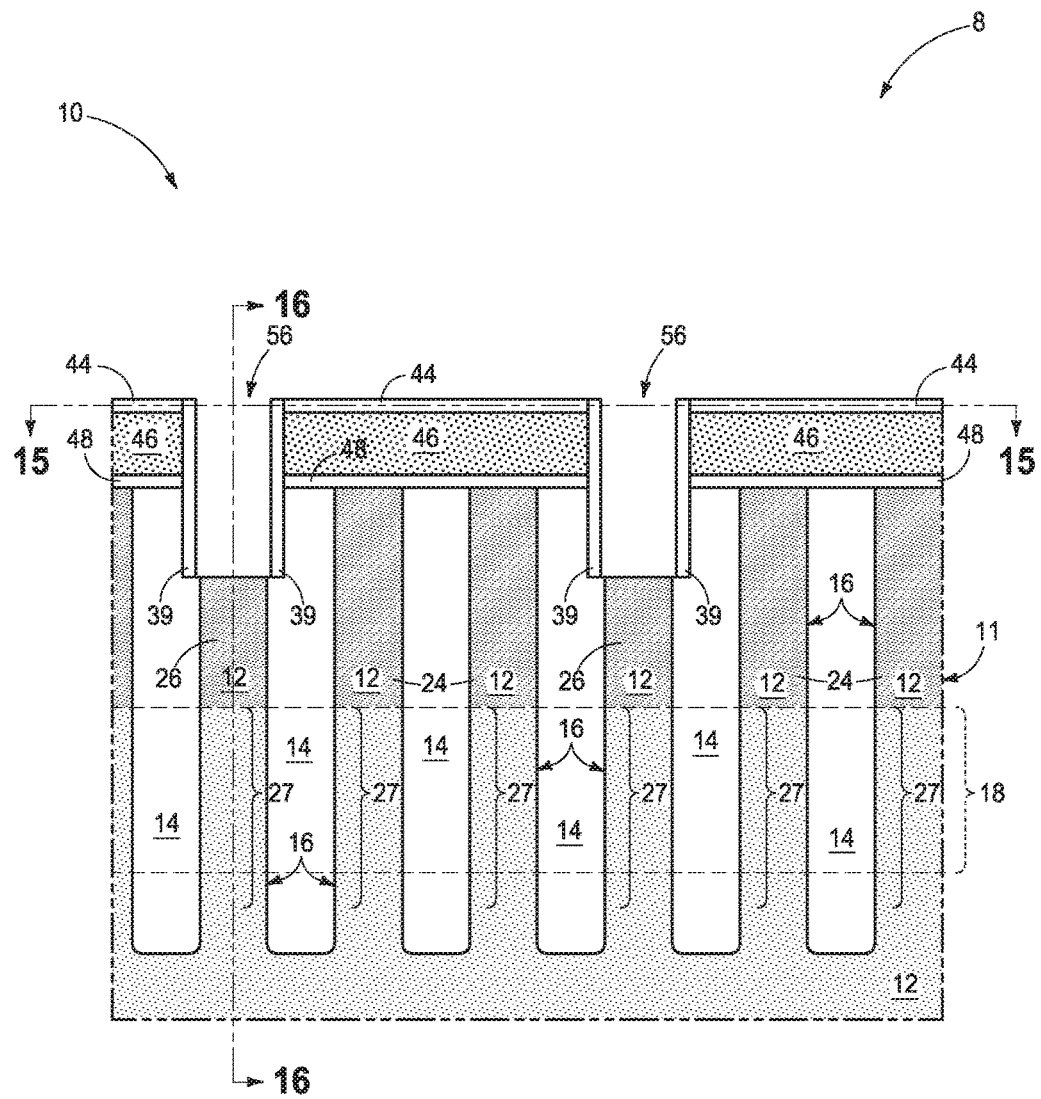
FIG. 14 is a view of the FIG. 11 substrate at a processing step subsequent to that shown by FIG. 11 and is taken through line 14-14 in FIGS. 15 and 16.
Figure 15:
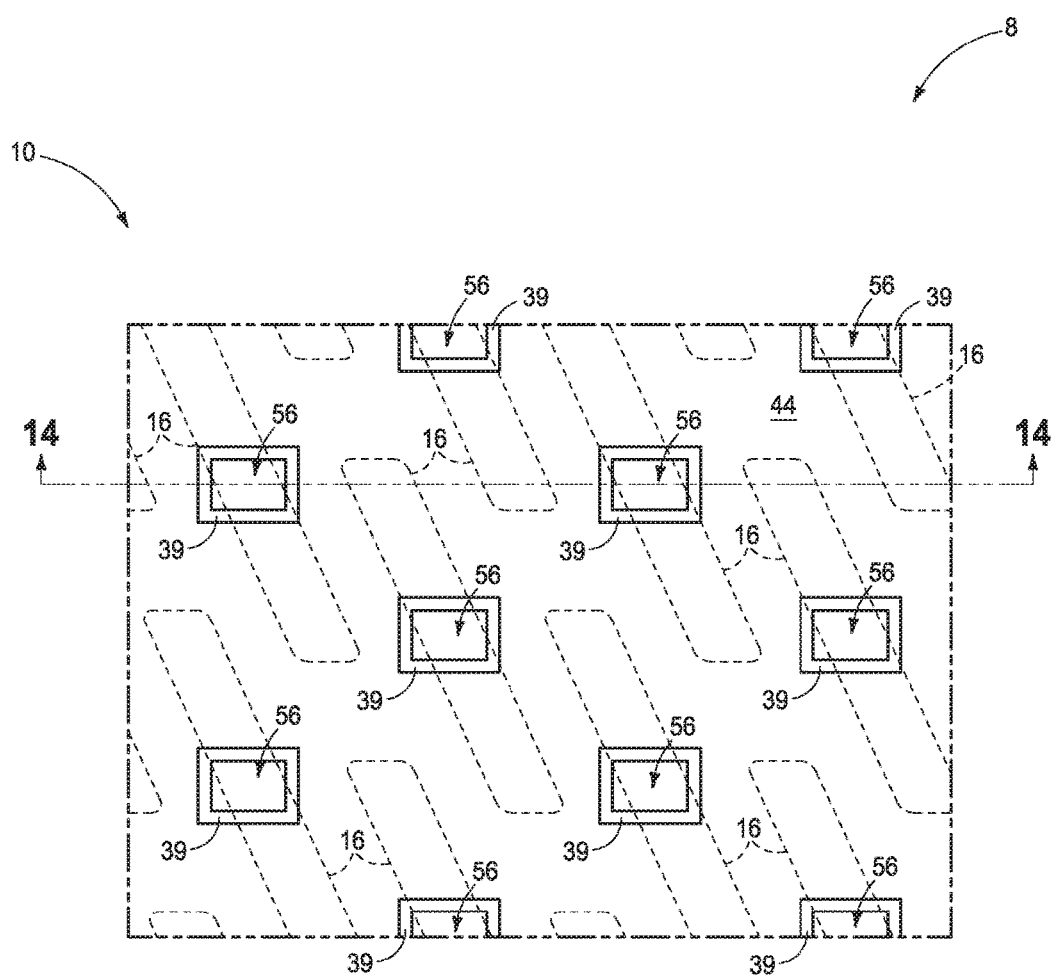
FIG. 15 is a view taken through line 15-15 in FIGS. 14 and 16.
Figure 16:
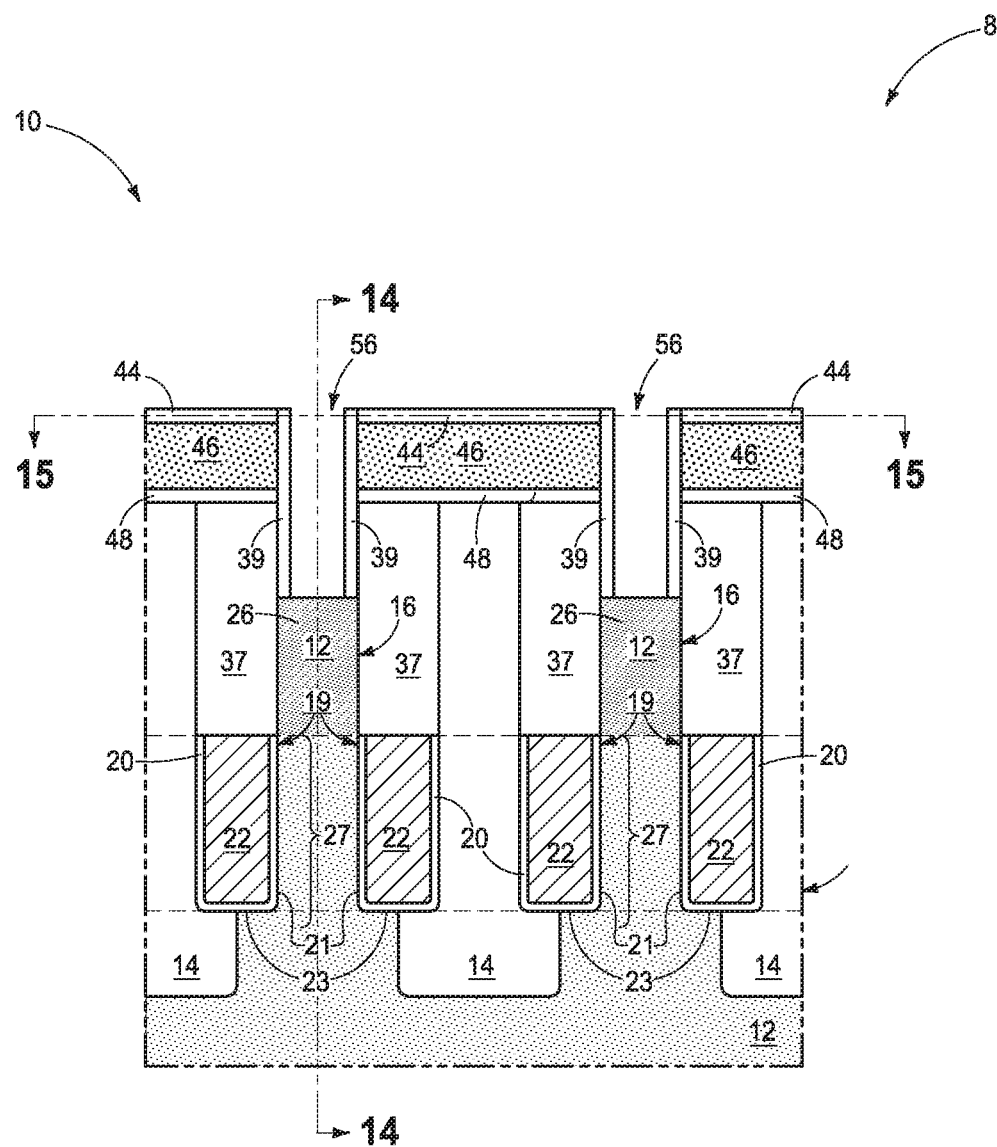
FIG. 16 is a view taken through line 16-16 in FIGS. 14 and 15.

Referring to FIGS. 14-16, and in one embodiment, sidewalls of contact openings 56 have been lined with insulator material (e.g., 39). Such may be formed, by way of example, by depositing the insulator material to the example depicted thickness, followed by maskless anisotropic etch back thereof to substantially remove such from upper horizontal surfaces. Thickness of the upper insulative material may be reduced thereby (not shown).

Figure 17:
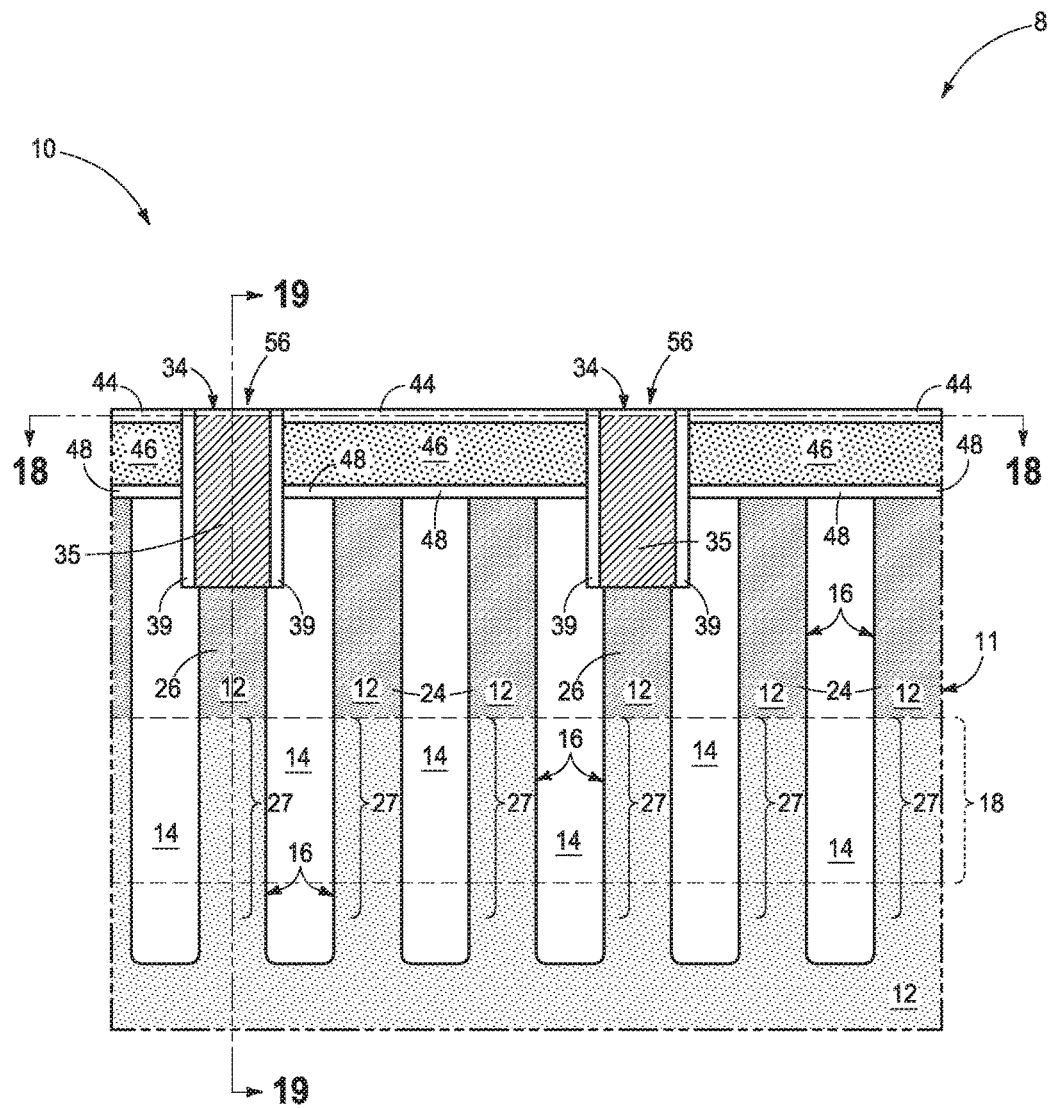
FIG. 17 is a view of the FIG. 14 substrate at a processing step subsequent to that shown by FIG. 14 and is taken through line 17-17 in FIGS. 18 and 19.
Figure 18:
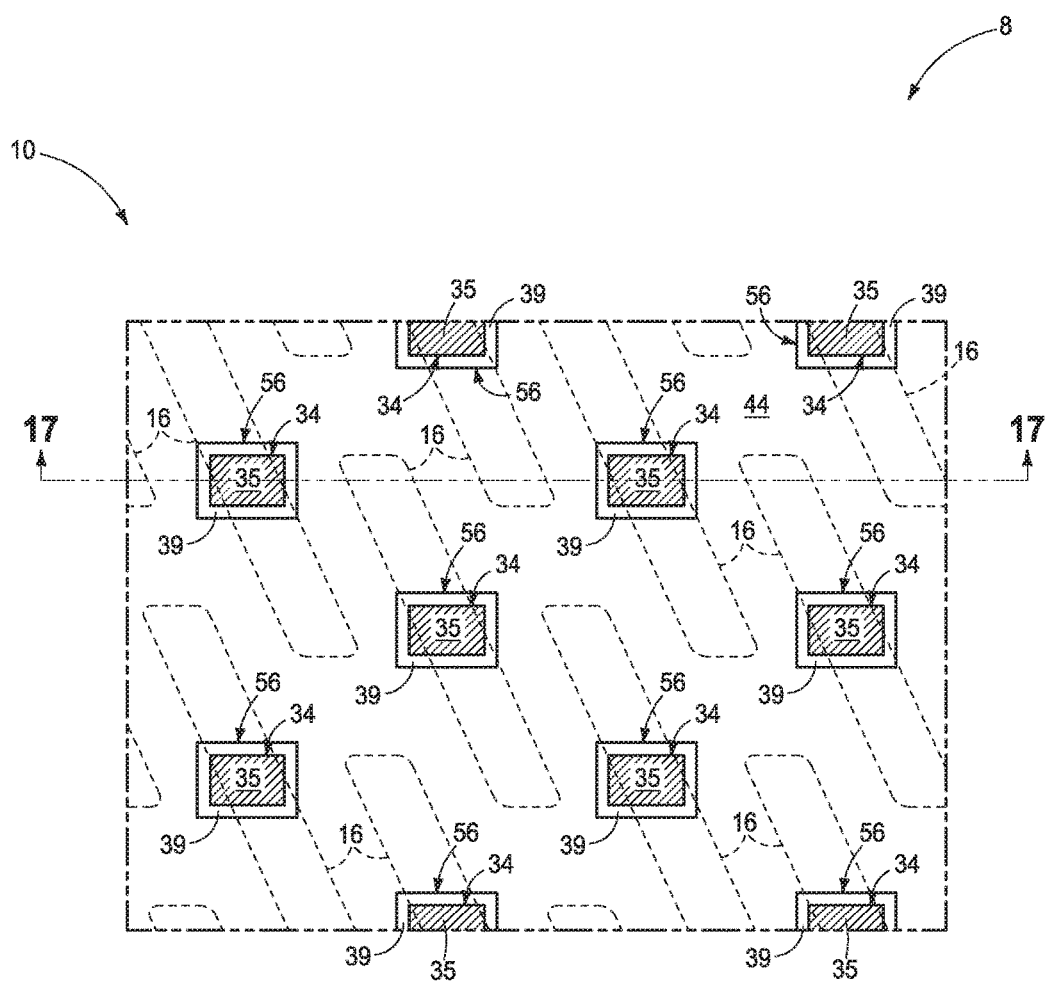
FIG. 18 is a view taken through line 18-18 in FIGS. 17 and 19.
Figure 19:
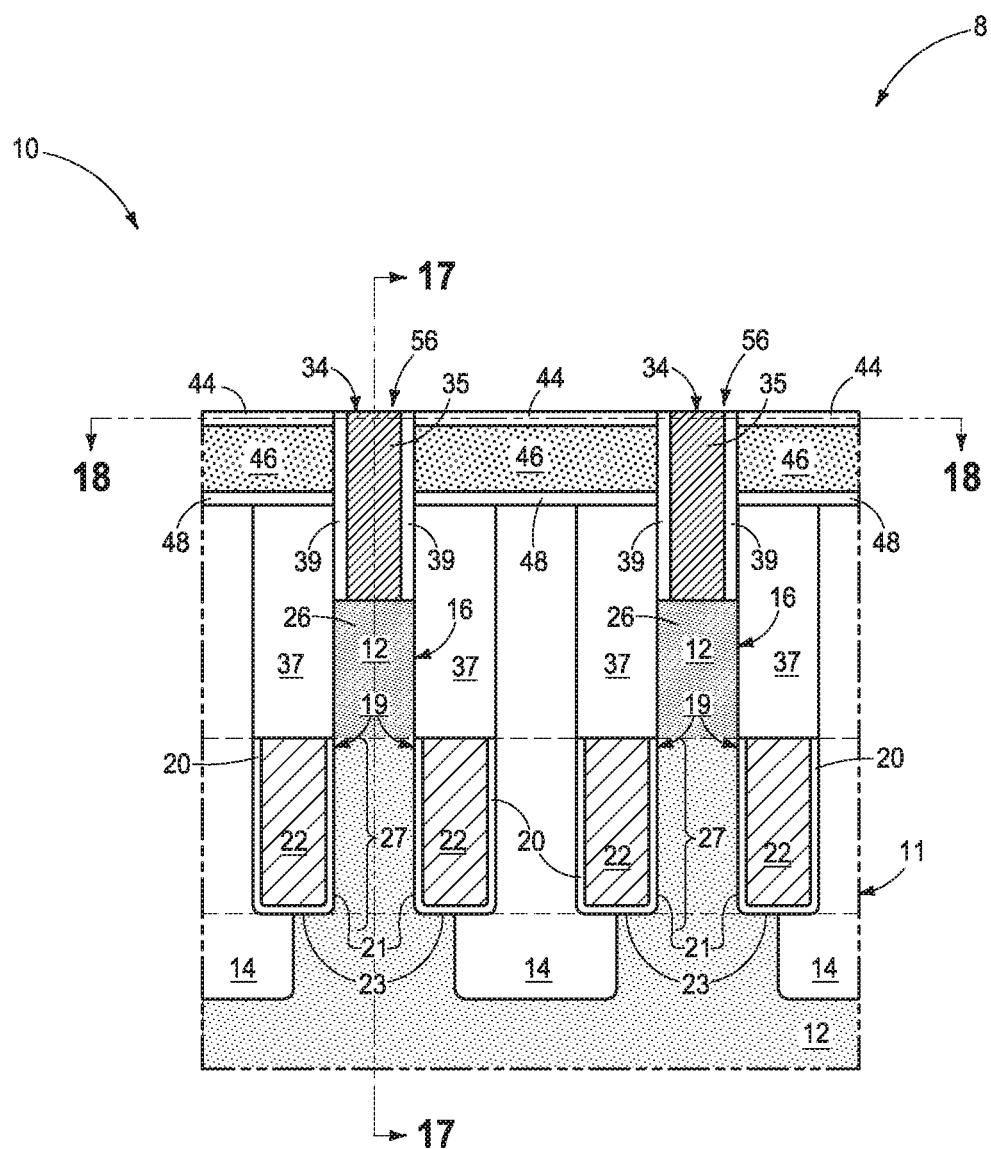
FIG. 19 is a view taken through line 19-19 in FIGS. 17 and 18.

Referring to FIGS. 17-19, conductor material (e.g., 35) has been formed in contact openings 56 directly against the individual conductive nodes. Such may occur by depositing the conductor material within contact openings 56 and atop the upper insulative material, followed by removing such conductor material back at least to the top surface of the upper insulative material. Thickness of the upper insulative material may be reduced thereby (not shown).

Figure 20:
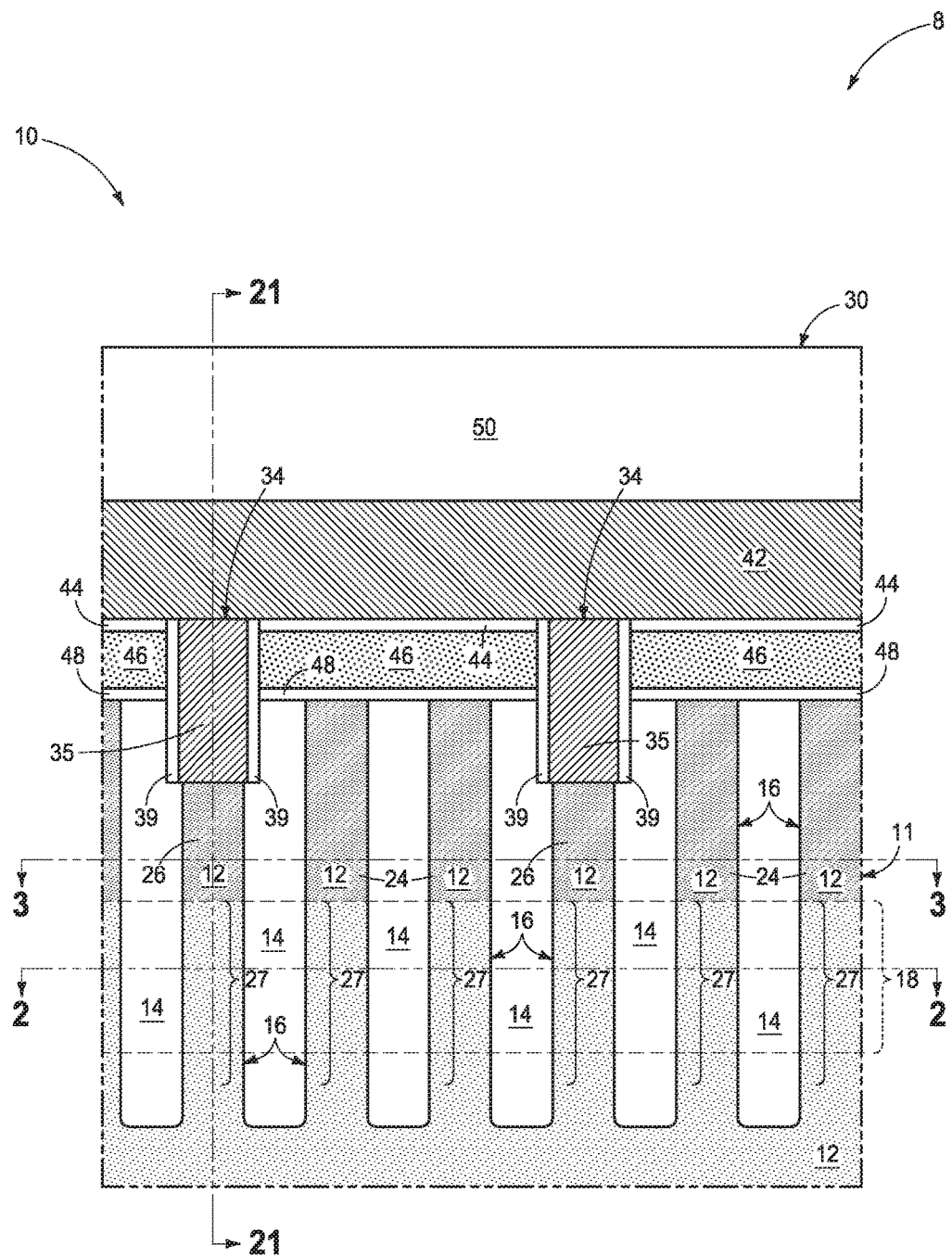
FIG. 20 is a view of the FIG. 17 substrate at a processing step subsequent to that shown by FIG. 17 and is taken through line 20-20 in FIG. 21.
Figure 21:
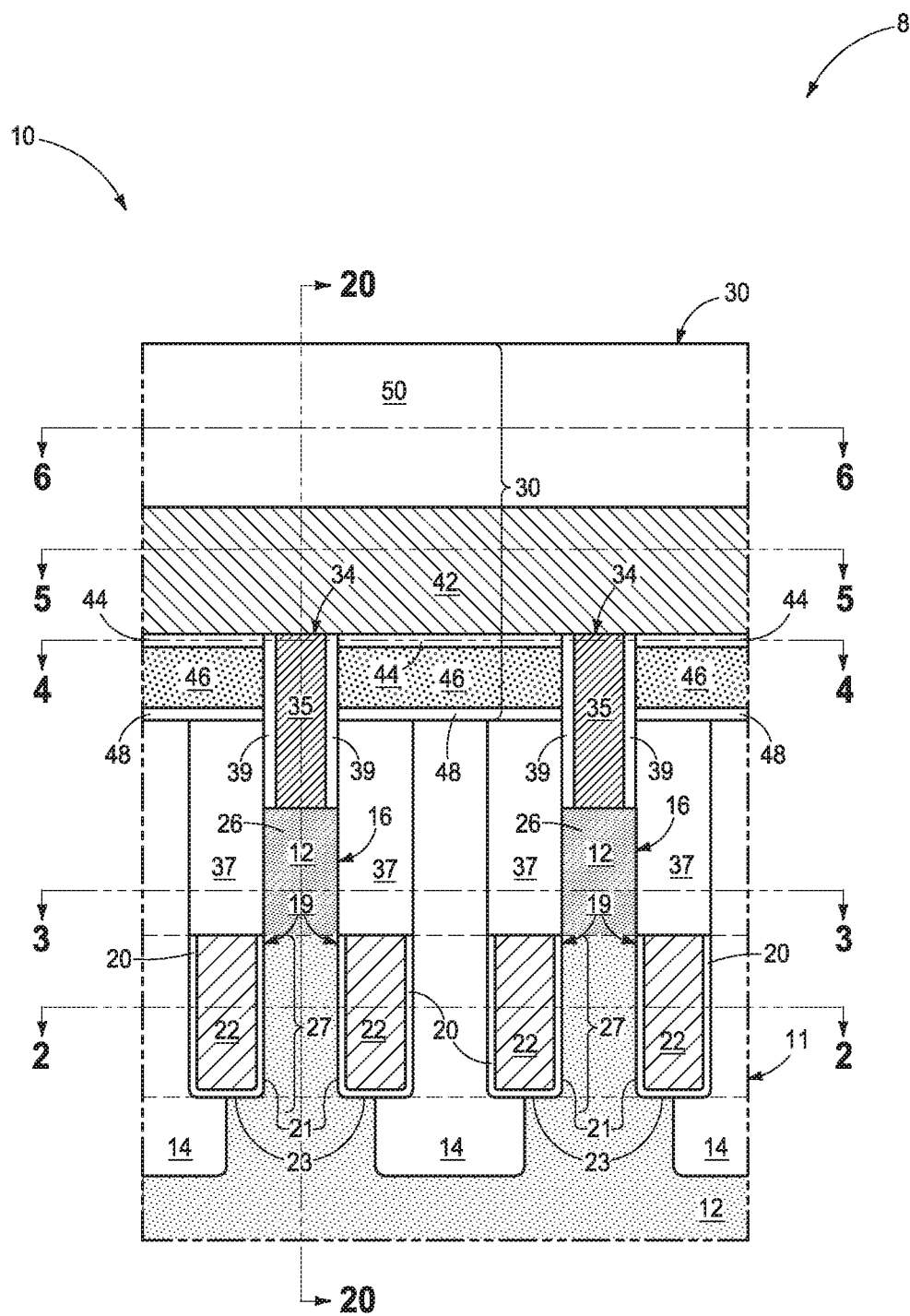
FIG. 21 is a view taken through line 21-21 in FIG. 20.

Referring to FIGS. 20 and 21, conductive material (e.g., 42) has been formed directly above the upper insulative material and the conductor material, with the conductive material being directly against the conductor material. Upper insulator material 50 is also shown as having been deposited above the conductive material.

Figure 22:
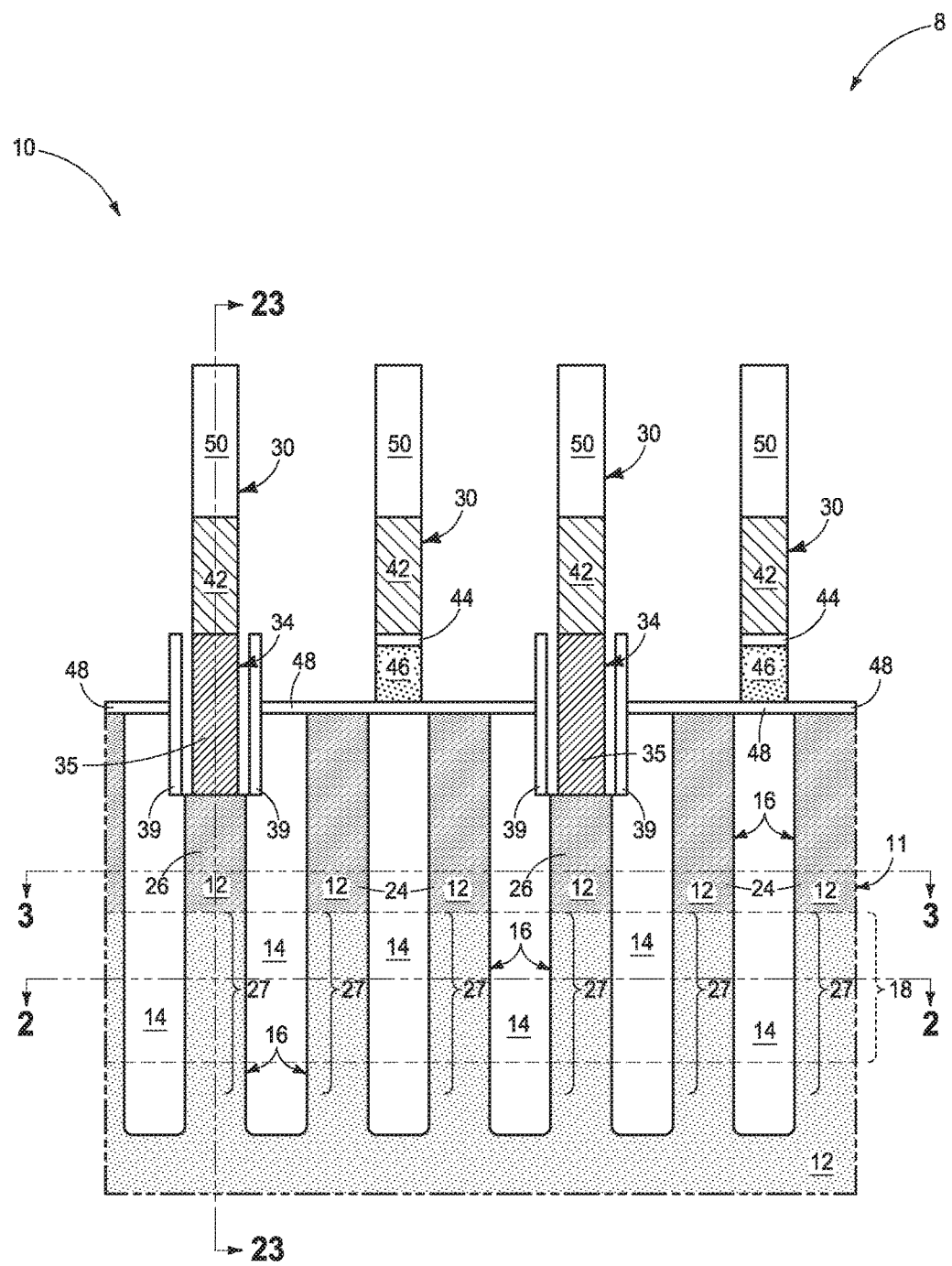
FIG. 22 is a view of the FIG. 20 substrate at a processing step subsequent to that shown by FIG. 20 and is taken through line 22-22 in FIG. 23.
Figure 23:
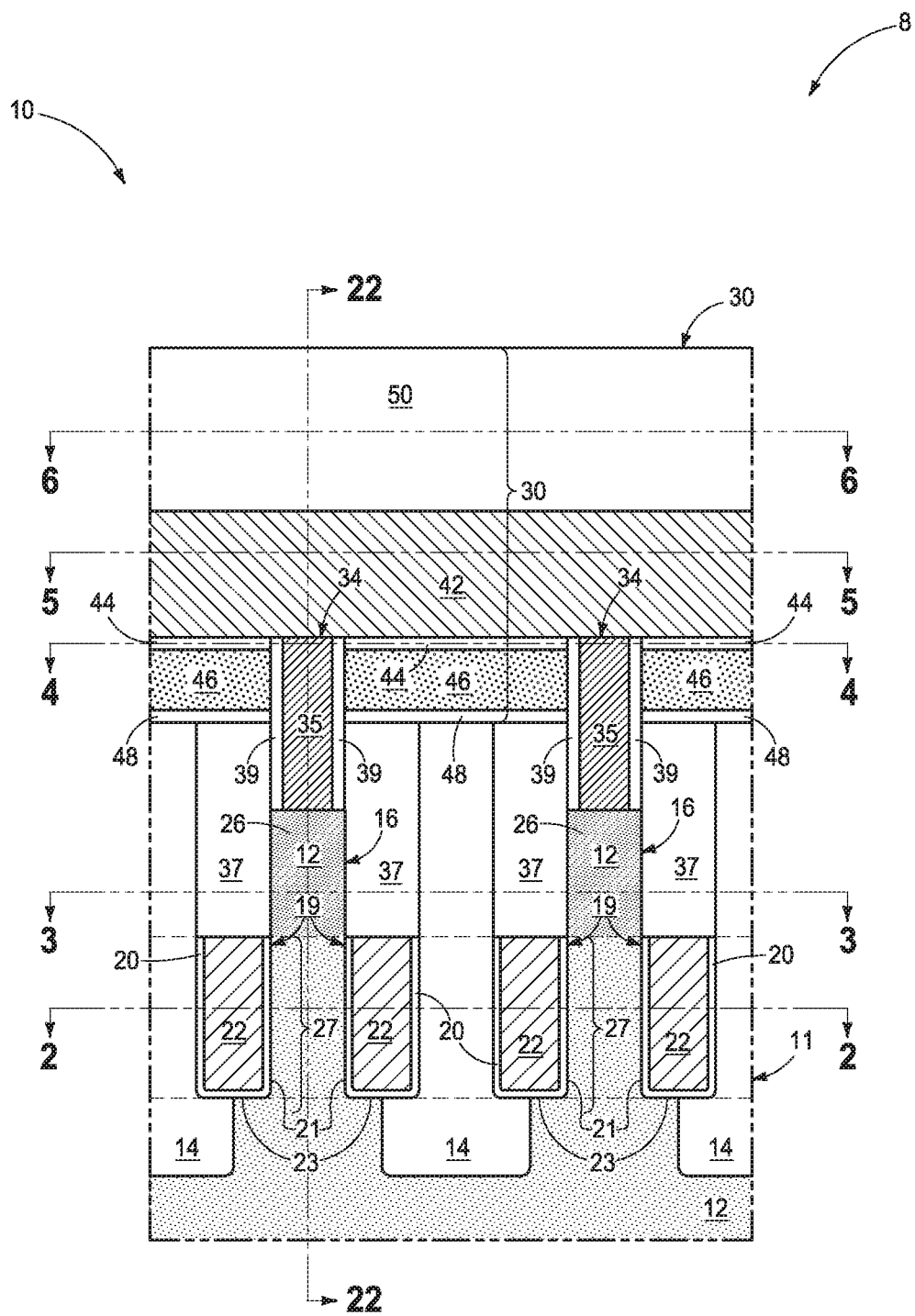
FIG. 23 is a view taken through line 23-23 in FIG. 22.

Referring to FIGS. 22 and 23, the conductive material, the upper insulative material (e.g., 44), and the semiconductor material have been patterned to form a conductive line structure (e.g., 30) above the conductive nodes. Thickness of upper insulator material 39 may be reduced thereby (not shown). In one embodiment and as shown, the conductor material (e.g., 35) has also been patterned to reduce its width within individual of the contact openings, and in one embodiment upper insulator material 50 has also been patterned. In one embodiment, such patterning has been collectively conducted in a single masking step (e.g., using photolithography and etch with or without hard masking material[s] and/or with or without pitch multiplication).

Elevationally-extending conductive vias 34 have been formed, and that are spaced longitudinally along the conductive line structure. The conductive vias comprise the conductor material and individually directly electrically couple the conductive line structure to the individual conductive nodes. The conductive line structure is formed to comprise the conductive material directly electrically coupled to the conductive vias and extend between immediately-longitudinally-adjacent of the conductive vias. The upper insulative material (e.g., 44) is directly below the upper conductive material between the immediately-longitudinally-adjacent conductive vias. The semiconductor material is directly below the upper insulative material (e.g., 44) between the immediately-longitudinally-adjacent conductive vias. The lower insulative material is directly below the semiconductor material between the immediately-longitudinally-adjacent conductive vias. In one embodiment, the semiconductor material is nowhere directly against the conductive material and is nowhere directly against any of the conductive vias.

Figure 24:
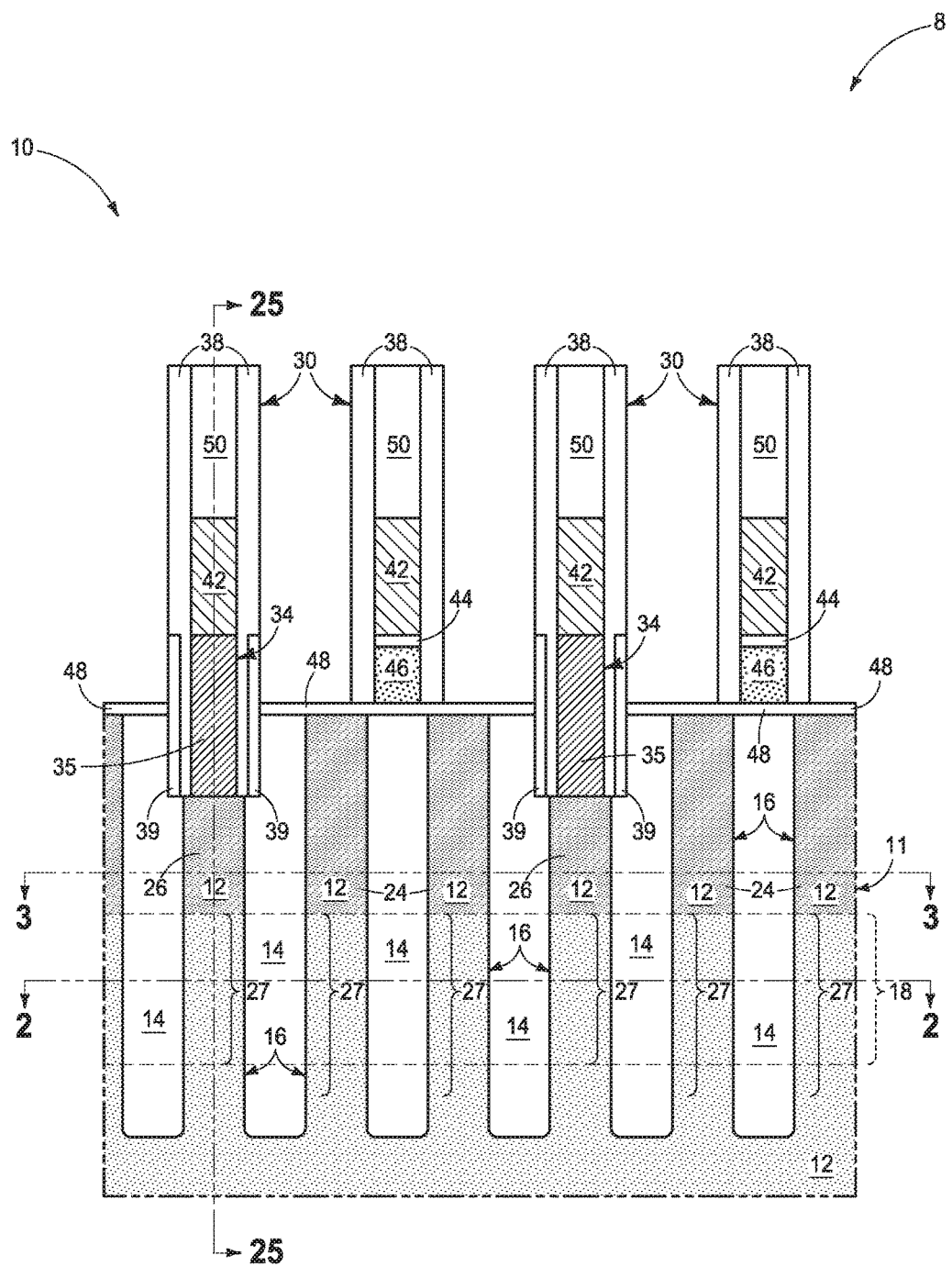
FIG. 24 is a view of the FIG. 22 substrate at a processing step subsequent to that shown by FIG. 22 and is taken through line 24-24 in FIG. 25.
Figure 25:
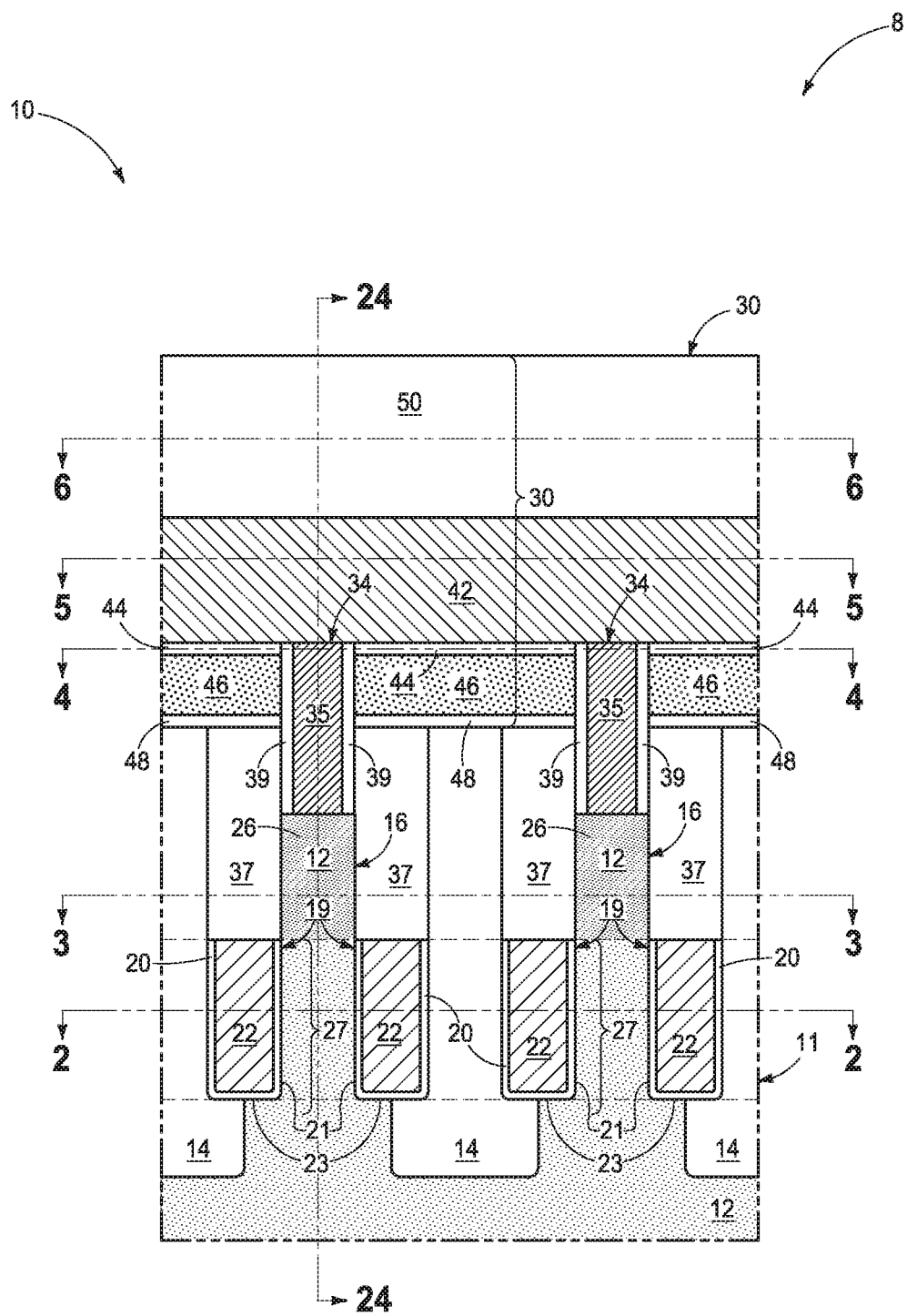
FIG. 25 is a view taken through line 25-25 in FIG. 24.

Referring to FIGS. 24 and 25, and in one embodiment, insulator material 38 has been formed. By way of example, such may be formed by deposition thereof at the example shown thickness, followed by maskless anisotropic etching to substantially remove such from upper horizontal surfaces.

Figure 6:
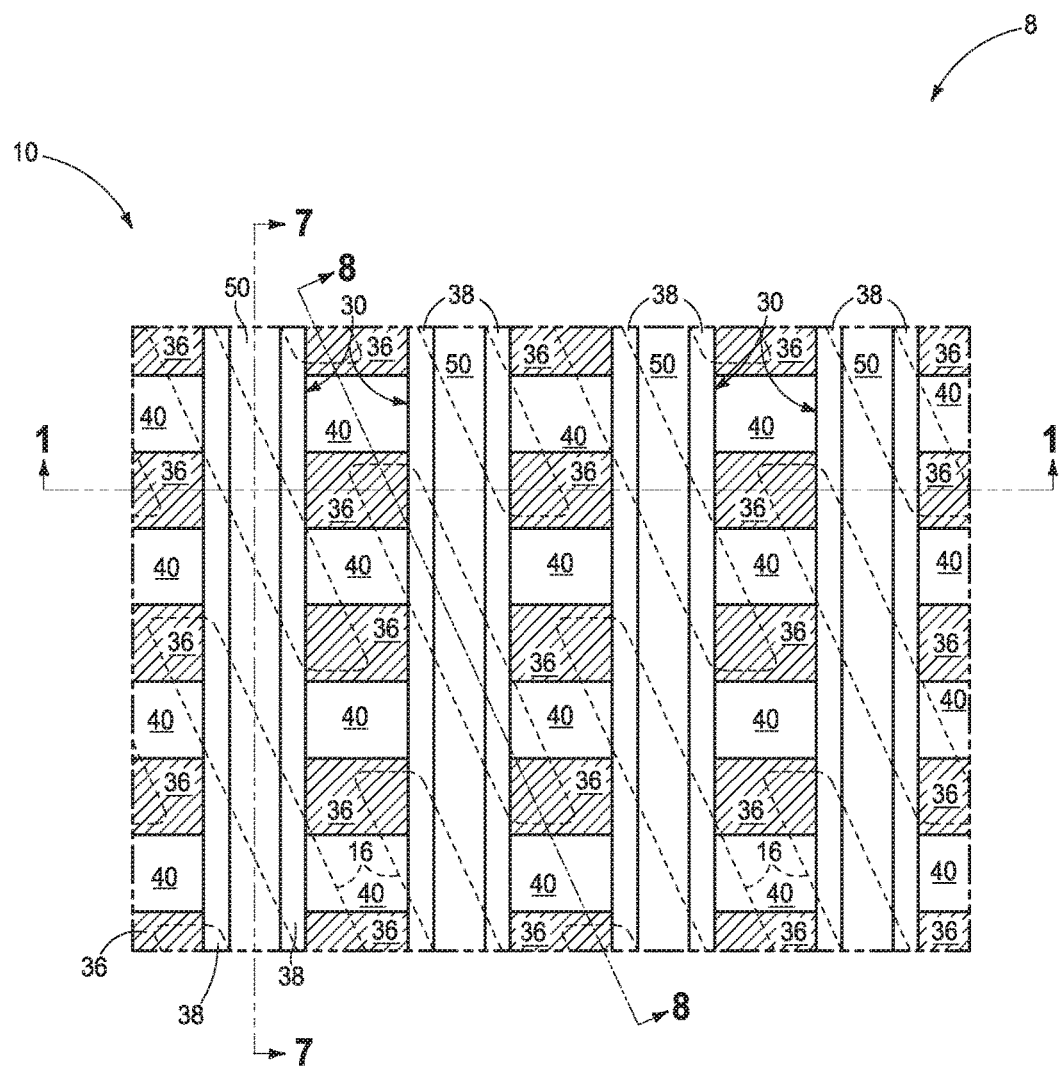
FIG. 6 is a view taken through line 6-6 in FIGS. 1, 7, and 8.
Figure 26:
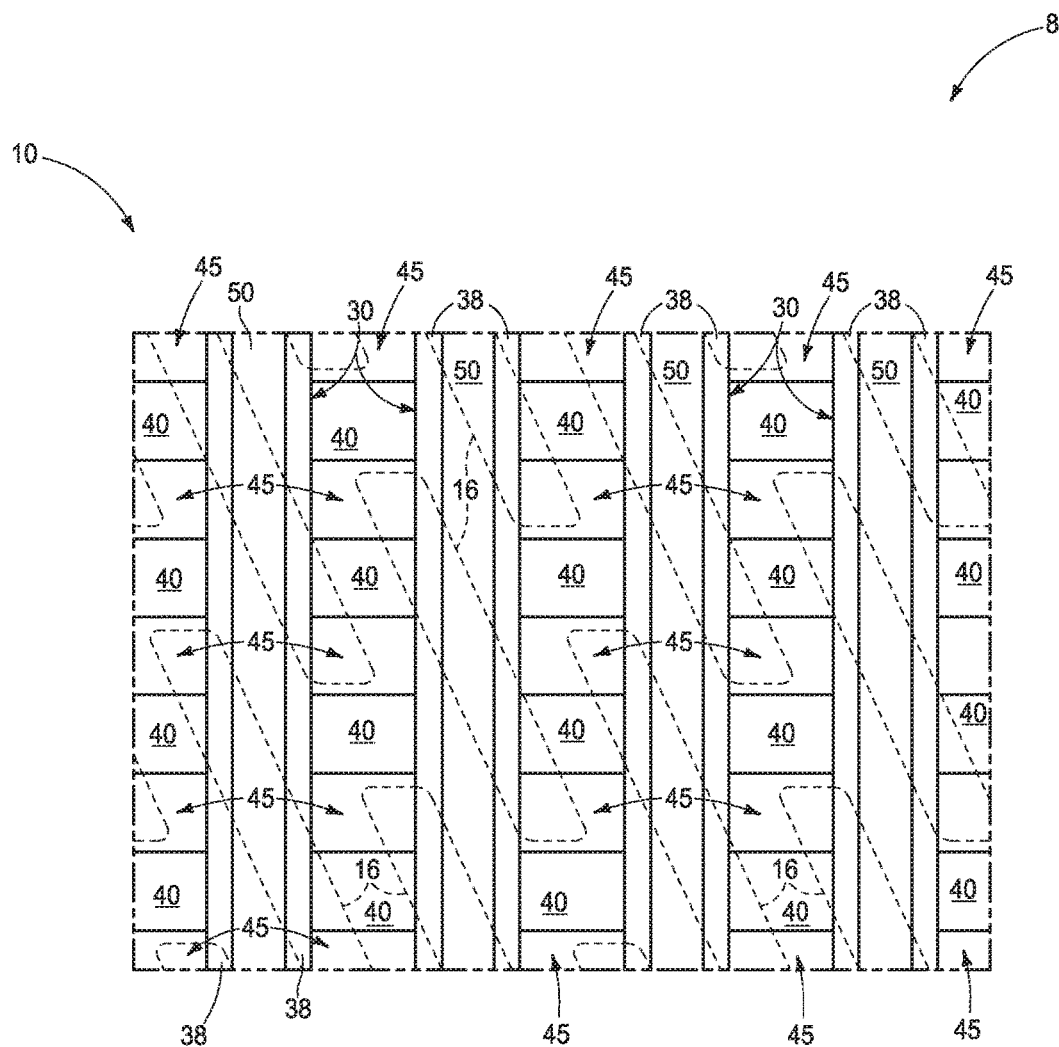
FIG. 26 is a view of the FIG. 24 substrate at a processing step subsequent to that shown by FIG. 22 and shown relative to the cross-section of FIG. 6.

Referring to FIG. 26, insulator material (e.g., 40) has been deposited and patterned as shown to form contact openings 45. Such may be subsequently filled with conductive material for forming conductive vias 36 (FIG. 6).

Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, an integrated circuitry construction comprises a substrate comprising conductive nodes of integrated circuitry. A conductive line structure is above the conductive nodes. Elevationally-extending conductive vias are spaced longitudinally along the conductive line structure. The conductive vias individually directly electrically couple the conductive line structure to individual of the conductive nodes. The conductive line structure comprises conductive material directly electrically coupled to the conductive vias and extending between immediately-longitudinally-adjacent of the conductive vias. An upper insulative material is directly below the conductive material between the immediately-longitudinally-adjacent conductive vias. Doped or undoped semiconductor material directly is below the upper insulative material between the immediately-longitudinally-adjacent conductive vias. A lower insulative material is directly below the semiconductor material between the immediately-longitudinally-adjacent conductive vias.

In some embodiments, a DRAM construction comprises pairs of recessed access devices. The recessed access devices individually comprise a conductive gate in a trench in semiconductive material. A gate insulator is along sidewalls and a base of the trench between the conductive gate and the semiconductive material. A pair of source/drain regions is in upper portions of the semiconductive material on opposing sides of the trench. A channel region is in the semiconductive material below the pair of source/drain regions along the trench sidewalls and around the trench base. One of the source/drain regions of the pair of source/drain regions in individual of the pairs of recessed access devices is laterally between the conductive gates in and is shared by the individual pairs of recessed access devices. The others of the source/drain regions of the pair of source/drain regions are not shared in the individual pairs of recessed access devices. A digitline structure is directly electrically coupled to the one shared source/drain region of multiple of the individual pairs of recessed access devices. A pair of capacitors are individually directly electrically coupled to one of the other source/drain regions in the individual pairs of recessed access devices. Elevationally-extending conductive vias are spaced longitudinally along the digitline structure. The conductive vias individually directly electrically couple the digitline line structure to individual of the shared source/drain regions of the individual pairs of recessed access devices. The conductive line structure comprises a conductive material directly electrically coupled to the conductive vias and extending between immediately-longitudinally-adjacent of the conductive vias. An upper insulative material is directly below the conductive material between the immediately-longitudinally-adjacent conductive vias. Doped or undoped semiconductor material is directly below the upper insulative material between the immediately-longitudinally-adjacent conductive vias. A lower insulative material is directly below the semiconductor material between the immediately-longitudinally-adjacent conductive vias.

In some embodiments, a method used in forming an integrated circuitry construction comprises providing a substrate comprising conductive nodes, a lower insulative material directly above the conductive nodes, doped or undoped semiconductor material directly above the lower insulative material, and an upper insulative material directly above the semiconductor material. Contact openings are formed through the upper insulative material, the semiconductor material, and the lower insulative material. The contact openings individually extend to individual of the conductive nodes. Conductor material is formed in the contact openings directly against the individual conductive nodes. Conductive material is formed directly above the upper insulative material and the conductor material. The conductive material is directly against the conductor material. The conductive material, the upper insulative material, the semiconductor material, and the lower insulative material are patterned to form a conductive line structure above the conductive nodes. Elevationally-extending conductive vias are spaced longitudinally along the conductive line structure and comprise the conductor material and individually directly electrically couple the conductive line structure to the individual conductive nodes. The conductive line structure is formed to comprise the conductive material directly electrically coupled to the conductive vias and to extend between immediately-longitudinally-adjacent of the conductive vias. The upper insulative material is directly below the upper conductive material between the immediately-longitudinally-adjacent conductive vias. The semiconductor material is directly below the upper insulative material between the immediately-longitudinally-adjacent conductive vias. The lower insulative material is directly below the semiconductor material between the immediately-longitudinally-adjacent conductive vias.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. An integrated circuitry construction comprising:
a substrate comprising conductive nodes of integrated circuitry;
a conductive line structure above the conductive nodes; and
elevationally-extending conductive vias spaced longitudinally along the conductive line structure, the conductive vias individually directly electrically coupling the conductive line structure to individual of the conductive nodes, the conductive line structure comprising:
conductive material directly electrically coupled to the conductive vias and extending between immediately-longitudinally-adjacent of the conductive vias;
an upper insulative material directly below the conductive material between the immediately-longitudinally-adjacent conductive vias;
doped or undoped semiconductor material directly below the upper insulative material between the immediately-longitudinally-adjacent conductive vias; and
a lower insulative material directly below the semiconductor material between the immediately-longitudinally-adjacent conductive vias.

2. The construction of claim 1 wherein the semiconductor material is nowhere directly against the conductive material and is nowhere directly against any of the conductive vias.

3. The construction of claim 1 wherein the semiconductor material is nowhere directly against any material that is conductive.

4. The construction of claim 1 wherein the semiconductor material is undoped.

5. The construction of claim 4 wherein the semiconductor material is devoid of conductivity-modifying impurity.

6. The construction of claim 1 wherein the semiconductor material is doped.

7. The construction of claim 6 wherein the semiconductor material is semiconductively doped.

8. The construction of claim 6 wherein the semiconductor material is conductively doped.

9. The construction of claim 1 wherein the semiconductor material comprises both doped and undoped portions.

10. The construction of claim 1 wherein the conductive material predominately comprises metal material and the semiconductor material predominately comprises a combination of polysilicon and conductivity-modifying dopant.

11. The construction of claim 10 wherein the conductive vias predominately comprise conductively-doped polysilicon.

12. The construction of claim 1 wherein the conductive material is directly against a top surface of the upper insulative material, the upper insulative material is directly against a top surface of the semiconductor material, and the semiconductor material is directly against a top surface of the lower insulative material.

13. The construction of claim 1 wherein the conductive vias and the upper insulative material have respective planar top surfaces that are coplanar.

14. The construction of claim 1 wherein the upper and lower insulative materials are of the same composition relative one another.

15. The construction of claim 14 comprising insulator material of a composition different from that of the insulative material, the insulator material being longitudinally between (a) and (b) along the conductive line structure, where:
(a): the upper insulative material, the semiconductor material, and the lower insulative material; and
(b): the conductive vias.

16. The construction of claim 1 wherein the conductive line structure comprises a digitline of memory circuitry.

17. The construction of claim 16 wherein the memory circuitry comprises DRAM.

18. A DRAM construction comprising:
pairs of recessed access devices, the recessed access devices individually comprising:
a conductive gate in a trench in semiconductive material;
a gate insulator along sidewalls and a base of the trench between the conductive gate and the semiconductive material;
a pair of source/drain regions in upper portions of the semiconductive material on opposing sides of the trench;
a channel region in the semiconductive material below the pair of source/drain regions along the trench sidewalls and around the trench base; and
one of the source/drain regions of the pair of source/drain regions in individual of the pairs of recessed access devices being laterally between the conductive gates in and being shared by the individual pairs of recessed access devices, the others of the source/drain regions of the pair of source/drain regions not being shared in the individual pairs of recessed access devices;
a digitline structure directly electrically coupled to the one shared source/drain region of multiple of the individual pairs of recessed access devices;
a pair of capacitors individually directly electrically coupled to one of the other source/drain regions in the individual pairs of recessed access devices; and
elevationally-extending conductive vias spaced longitudinally along the digitline structure, the conductive vias individually directly electrically coupling the digitline line structure to individual of the shared source/drain regions of the individual pairs of recessed access devices, the conductive line structure comprising:
conductive material directly electrically coupled to the conductive vias and extending between immediately-longitudinally-adjacent of the conductive vias;
an upper insulative material directly below the conductive material between the immediately-longitudinally-adjacent conductive vias;
doped or undoped semiconductor material directly below the upper insulative material between the immediately-longitudinally-adjacent conductive vias; and
a lower insulative material directly below the semiconductor material between the immediately-longitudinally-adjacent conductive vias.

19. A method used in forming an integrated circuitry construction, comprising:
providing a substrate comprising conductive nodes, a lower insulative material directly above the conductive nodes, doped or undoped semiconductor material directly above the lower insulative material, and an upper insulative material directly above the semiconductor material;
forming contact openings through the upper insulative material, the semiconductor material, and the lower insulative material; the contact openings individually extending to individual of the conductive nodes;

forming conductor material in the contact openings that is directly against the individual conductive nodes;

forming conductive material directly above the upper insulative material and the conductor material, the conductive material being directly against the conductor material;

patterning the conductive material, the upper insulative material, the semiconductor material, and the lower insulative material to form a conductive line structure above the conductive nodes;

elevationally-extending conductive vias being spaced longitudinally along the conductive line structure, the conductive vias comprising the conductor material and individually directly electrically coupling the conductive line structure to the individual conductive nodes, the conductive line structure being formed to comprise:

the conductive material directly electrically coupled to the conductive vias and extending between immediately-longitudinally-adjacent of the conductive vias;

the upper insulative material directly below the upper conductive material between the immediately-longitudinally-adjacent conductive vias;

the semiconductor material directly below the upper insulative material between the immediately-longitudinally-adjacent conductive vias; and the lower insulative material directly below the semiconductor material between the immediately-longitudinally-adjacent conductive vias.

20. The method of claim 19 comprising lining sidewalls of the contact openings with insulator material before forming the conductor material in the contact openings.

21. The method of claim 19 wherein the semiconductor material is nowhere directly against the conductive material and is nowhere directly against any of the conductive vias.

22. The method of claim 19 comprising after forming the conductor material in the contact openings, patterning the conductor material to reduce its width within individual of the contact openings.

23. The method of claim 22 wherein the patterning of the conductor material and the patterning of the conductive material, the upper insulative material, the semiconductor material, and the lower insulative material are collectively conducted in a single masking step.

24. The method of claim 19 wherein the integrated circuitry comprises DRAM, the conductive nodes are source/drain regions of recessed access devices of the DRAM, and the conductive line structure comprises a digitline structure above the recessed access devices.

25. The method of claim 24 wherein, the recessed access devices are formed to comprise pairs of the recessed access devices, the recessed access devices individually comprising:

a conductive gate in a trench in semiconductive material;

a gate insulator along sidewalls and a base of the trench between the conductive gate and the semiconductive material;

a pair of source/drain regions in upper portions of the semiconductive material on opposing sides of the trench;

a channel region in the semiconductive material below the pair of source/drain regions along the trench sidewalls and around the trench base; and one of the source/drain regions of the pair of source/drain regions in individual of the pairs of recessed access devices being laterally between the conductive gates in and being shared by the individual pairs of recessed access devices, the others of the source/drain regions of the pair of source/drain regions not being shared in the individual pairs of recessed access devices; and the conductive gates being formed in the trenches in the semiconductive material before forming the digitline structure.

* * * * *